(12) United States Patent
Sim et al.

(10) Patent No.: US 11,877,490 B2
(45) Date of Patent: Jan. 16, 2024

(54) LIGHT EMITTING DISPLAY APPARATUS

(71) Applicant: LG Display Co., Ltd., Seoul (KR)

(72) Inventors: Dongmin Sim, Paju-si (KR);
Hyekyung Choi, Seoul (KR);
Kyunghoon Han, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/901,862

(22) Filed: Jun. 15, 2020

(65) Prior Publication Data

US 2021/0043690 A1 Feb. 11, 2021

(30) Foreign Application Priority Data

Aug. 6, 2019 (KR) .................. 10-2019-0095725

(51) Int. Cl.
| | |
|---|---|
| G09G 5/00 | (2006.01) |
| H10K 59/38 | (2023.01) |
| G06F 3/041 | (2006.01) |
| G09G 3/20 | (2006.01) |
| H10K 50/844 | (2023.01) |
| H10K 50/852 | (2023.01) |
| H10K 59/40 | (2023.01) |
| H10K 59/122 | (2023.01) |
| H10K 102/00 | (2023.01) |

(52) U.S. Cl.
CPC ......... H10K 59/38 (2023.02); G06F 3/0412 (2013.01); G09G 3/2003 (2013.01); H10K 50/844 (2023.02); H10K 50/852 (2023.02); H10K 59/122 (2023.02); H10K 59/40 (2023.02); H10K 2102/00 (2023.02); *H10K 2102/3026* (2023.02)

(58) Field of Classification Search
CPC . H01L 27/322; H01L 27/323; H01L 27/3246; H01L 51/5253; H01L 51/5265; H01L 2251/301; H01L 2251/5315; G06F 3/0412; G09G 3/2003; H10K 59/38; H10K 59/40; H10K 59/122
USPC .......................................................... 345/204
See application file for complete search history.

(56) References Cited

U.S. PATENT DOCUMENTS

| | | | |
|---|---|---|---|
| 10,756,136 B1 * | 8/2020 | Ma ..................... | H01L 31/147 |
| 2015/0243930 A1 | 8/2015 | Kim et al. | |
| 2017/0031205 A1 * | 2/2017 | Lee .................... | G02F 1/133514 |
| 2018/0284541 A1 * | 10/2018 | Kang ................. | G02F 1/133621 |
| 2019/0121176 A1 * | 4/2019 | Lee ..................... | G02F 1/1336 |

(Continued)

FOREIGN PATENT DOCUMENTS

| CN | 103681752 A | 3/2014 |
|---|---|---|
| CN | 103985733 A | 8/2014 |

(Continued)

*Primary Examiner* — Jennifer T Nguyen
(74) *Attorney, Agent, or Firm* — Birch, Stewart, Kolasch & Birch, LLP

(57) ABSTRACT

A light emitting display apparatus includes a substrate including a plurality of sub-pixels, an overcoating layer on the substrate and having a base portion and a protrusion portion, a first electrode disposed to cover the base portion and a side portion of the protrusion portion at the plurality of sub-pixels, a bank layer covering a portion of the first electrode and the overcoating layer, a light emitting layer and a second electrode on the first electrode and the bank layer at the plurality of sub-pixels, and a cut-off layer on the second electrode to overlap the bank layer.

24 Claims, 11 Drawing Sheets

(56) References Cited

U.S. PATENT DOCUMENTS

| | | | | |
|---|---|---|---|---|
| 2019/0148467 A1* | 5/2019 | Chung | ............... | H01L 51/524 |
| | | | | 257/40 |
| 2019/0148647 A1* | 5/2019 | Akashi | ............... | C07D 471/04 |
| | | | | 257/40 |
| 2019/0157354 A1* | 5/2019 | Lee | ............... | H01L 27/3211 |
| 2019/0189701 A1* | 6/2019 | Bang | ............... | H01L 51/5271 |
| 2019/0293990 A1* | 9/2019 | Kwon | ............... | G02F 1/133617 |
| 2020/0243631 A1* | 7/2020 | Wu | ............... | H01L 27/326 |
| 2021/0343805 A1* | 11/2021 | Hu | ............... | H10K 71/00 |

FOREIGN PATENT DOCUMENTS

| | | |
|---|---|---|
| KR | 10-2010-0029885 A | 3/2010 |
| KR | 10-2013-0085195 A | 7/2013 |
| KR | 10-2017-0031613 A | 3/2017 |

* cited by examiner

LIGHT EMITTING DISPLAY APPARATUS

CROSS-REFERENCE TO RELATED APPLICATIONS

This application claims the priority benefit of Korean Patent Application No. 10-2019-0095725 filed on Aug. 6, 2019, with the Korean Intellectual Property Office, the entire contents of this application are expressly incorporated herein by reference into the present application.

BACKGROUND

Technical Field

The present disclosure relates to a light emitting display apparatus, and more particularly, to a light emitting display apparatus capable of improving light extraction efficiency and at the same time, improving color gamut by inhibiting or preventing a change in color coordinates.

Description of the Related Art

Recently, as our society advances toward an information-oriented society, the field of display apparatuses for visually expressing electrical information signals has rapidly advanced. Various display apparatuses, having excellent performance in terms of thinness, lightness, and low power consumption, are being developed correspondingly.

Among various display apparatuses, a light emitting display apparatus is a self-light emitting display apparatus in which a separate light source is not needed, which is different from a liquid crystal display apparatus. Therefore, the light emitting display apparatus can be manufactured to have lightness and thinness. Further, the light emitting display apparatus has advantages in terms of power consumption due to a low voltage driving, and is excellent in terms of a color implementation, a response speed, a viewing angle, and a contrast ratio (CR). Therefore, the light emitting display apparatuses are expected to be utilized in various fields.

SUMMARY

Light emitted from a light emitting layer of a light emitting display apparatus can output to the outside of the light emitting display apparatus through various components of the light emitting display apparatus. However, in the light emitted from the light emitting layer, there exists light trapped inside the light emitting display apparatus without coming out of the light emitting display apparatus, whereby light extraction efficiency of the light emitting display apparatus is problematic.

For example, there is a problem in which some of the light emitted from the light emitting layer is trapped in the light emitting display apparatus due to a total reflection loss, a waveguide loss, and a surface plasmon loss. Here, the total reflection loss refers to a degradation of the light extraction efficiency due to the light trapped in the light emitting display apparatus due to the total reflection at an interface between a substrate and the air, among the light emitted from the light emitting layer. The waveguide loss refers to the degradation of light extraction efficiency due to the total reflection at an interface of components in the light emitting display apparatus. The surface plasmon loss refers to a situation when light vibrates free electrons of a metal surface due to a phenomenon that the light is absorbed onto the metal surface during light incidence and propagation, whereby the reflection or transmission of the light is prevented to thereby result in a degradation in light extracting efficiency.

To address the above and other limitations associated with the light emitting display apparatuses, the inventors of the present disclosure have invented a light emitting display apparatus having a new structure to improve light extraction efficiency of the light emitting display apparatus by reducing the total reflection loss and the waveguide loss. For example, the inventors of the present disclosure formed an overcoating layer to have a base portion having a planar upper surface and a protrusion portion protruding from the base portion, and dispose an anode having a reflective layer on a side portion of the protrusion portion and the base portion. Accordingly, the reflective layer of the anode formed at the side portion of the protrusion portion can be as a side mirror, and some of the light trapped in the light emitting display apparatus by total reflection is extracted to a front direction of the light emitting display apparatus, whereby light extraction efficiency of the light emitting display apparatus is improved.

On the other hand, the inventors of the present disclosure have recognized that light additionally extracted from the light emitting display apparatus having a structure described above may cause a change in color coordinates, which may be an issue.

For example, when a reflective electrode is disposed on a side portion of a protrusion portion of the light emitting display apparatus, light is extracted upwardly of the light emitting display apparatus in a non-light emitting area, thereby allowing for improvements in light extraction efficiency. However, light extracted upwardly of the light emitting display apparatus by being reflected from the reflective electrode exhibits a photoluminescence (PL) spectrum. Accordingly, additionally extracted light can be greater in a long wavelength region than in a short wavelength region. Thus, a sub-pixel that emits light of a short wavelength region, such as a blue sub-pixel, may have a problem in which a color coordinate change can occur.

Accordingly, the inventors of the present disclosure have invented an improved light emitting display apparatus having a novel structure, capable of preventing or minimizing a change in color coordinates, while improving light extraction efficiency.

An aspect of the present disclosure is to provide a light emitting display apparatus capable of minimizing light in a long wavelength region that can occur when using an anode having a side mirror shape.

Another aspect of the present disclosure is to reduce a change in color coordinates of extracted light.

Additional features and aspects will be set forth in the description that follows, and in part will be apparent from the description, or can be learned by practice of the inventive concepts provided herein. Other features and aspects of the inventive concepts can be realized and attained by the structure particularly pointed out in the written description, or derivable therefrom, and the claims hereof as well as the appended drawings.

According to an embodiment of the present disclosure, a light emitting display apparatus can include a substrate including a plurality of sub-pixels, an overcoating layer on the substrate and having a base portion and a protrusion portion, a first electrode disposed to cover the base portion and a side portion of the protrusion portion at the plurality of sub-pixels, a bank layer covering a portion of the first electrode and the overcoating layer, a light emitting layer and a second electrode on the first electrode and the bank layer at the plurality of sub-pixels, and a cut-off layer on the second electrode to overlap the bank layer.

According to another embodiment of the present disclosure, a light emitting display apparatus can include a substrate including a sub-pixel having a light emitting area and a non-light emitting area, an overcoating layer having a protrusion portion protruding from the non-light emitting area, a light emitting element including a first electrode contacting the protrusion portion, a light emitting layer on the first electrode, and a second electrode on the light emitting layer, a bank layer covering a portion of the first electrode and the protrusion portion, and a color coordinate change prevention layer at the non-light emitting area on the light emitting element, to minimize a color coordinate change caused by light which is reflected and extracted from the first electrode contacting the protrusion portion, among light emitted from the light emitting layer.

Other devices, systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

According to an exemplary embodiment of the present disclosure, light extraction efficiency of the light emitting display apparatus can improve by using an anode having a side mirror shape.

According to an exemplary embodiment of the present disclosure, color gamut can improve by inhibiting or preventing a change in color coordinates due to additionally extracted light that contributes to improvements in light efficiency.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, that can be included to provide a further understanding of the disclosure and are incorporated in and constitute a part of this specification, illustrate embodiments of the disclosure and together with the description serve to explain various principles of the disclosure.

DETAILED DESCRIPTION OF THE EMBODIMENTS

Figure 1:
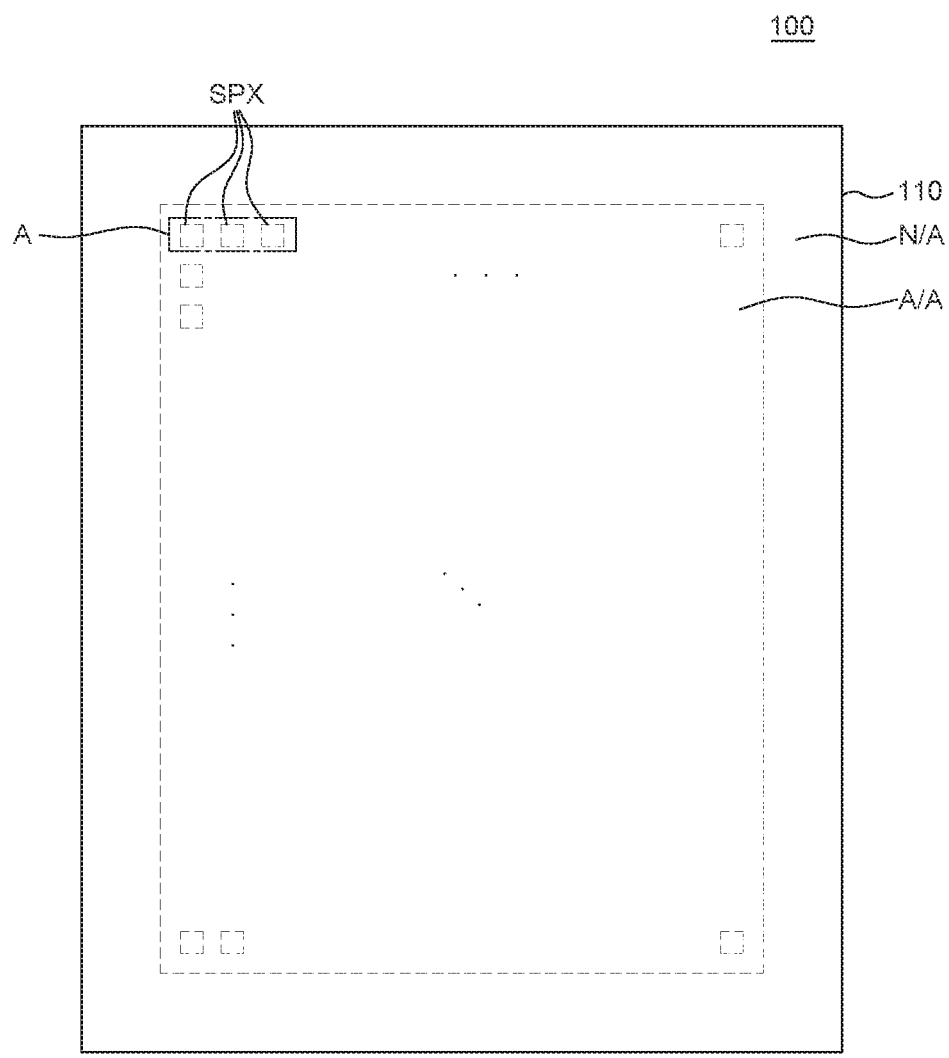
FIG. 1 is a plan view of a light emitting display apparatus according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer (or multiple layers) or another element (or multiple elements) can be interposed directly on the other element or therebetween.

Although the terms "first", "second", and the like are used for describing various components, these components are not confined by these terms. These terms are merely used for distinguishing one component from the other components and may not define any order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to accompanying drawings.

Figure 2:
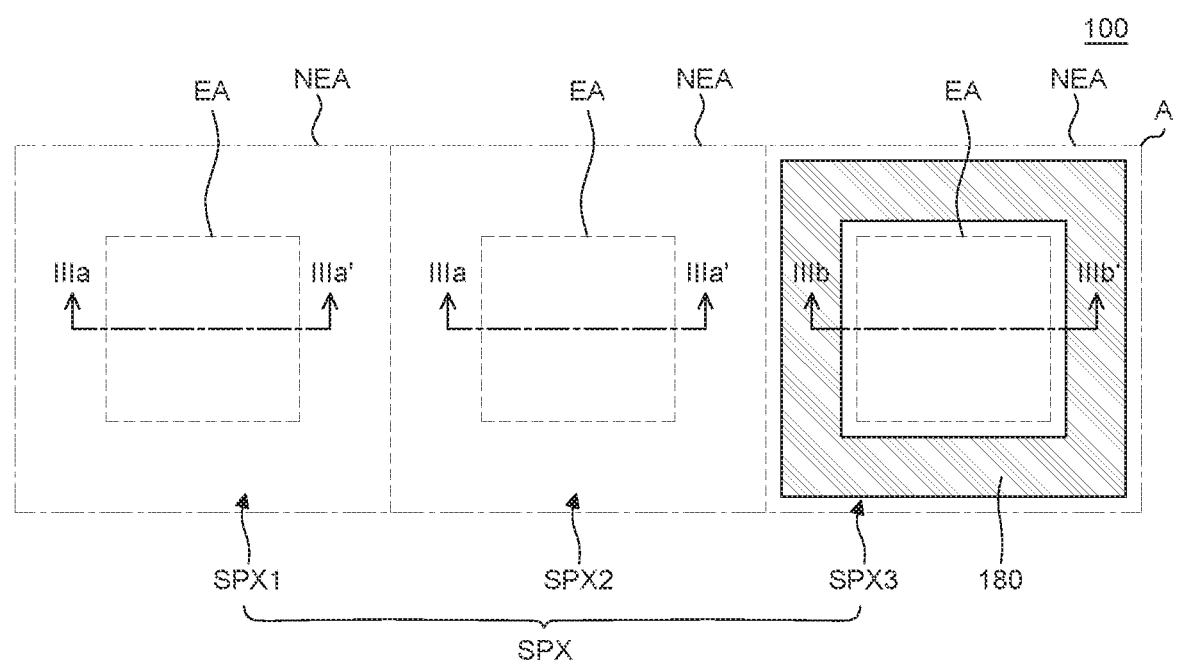
FIG. 2 is an enlarged plan view of region 'A' of FIG. 1.
Figure 3A:
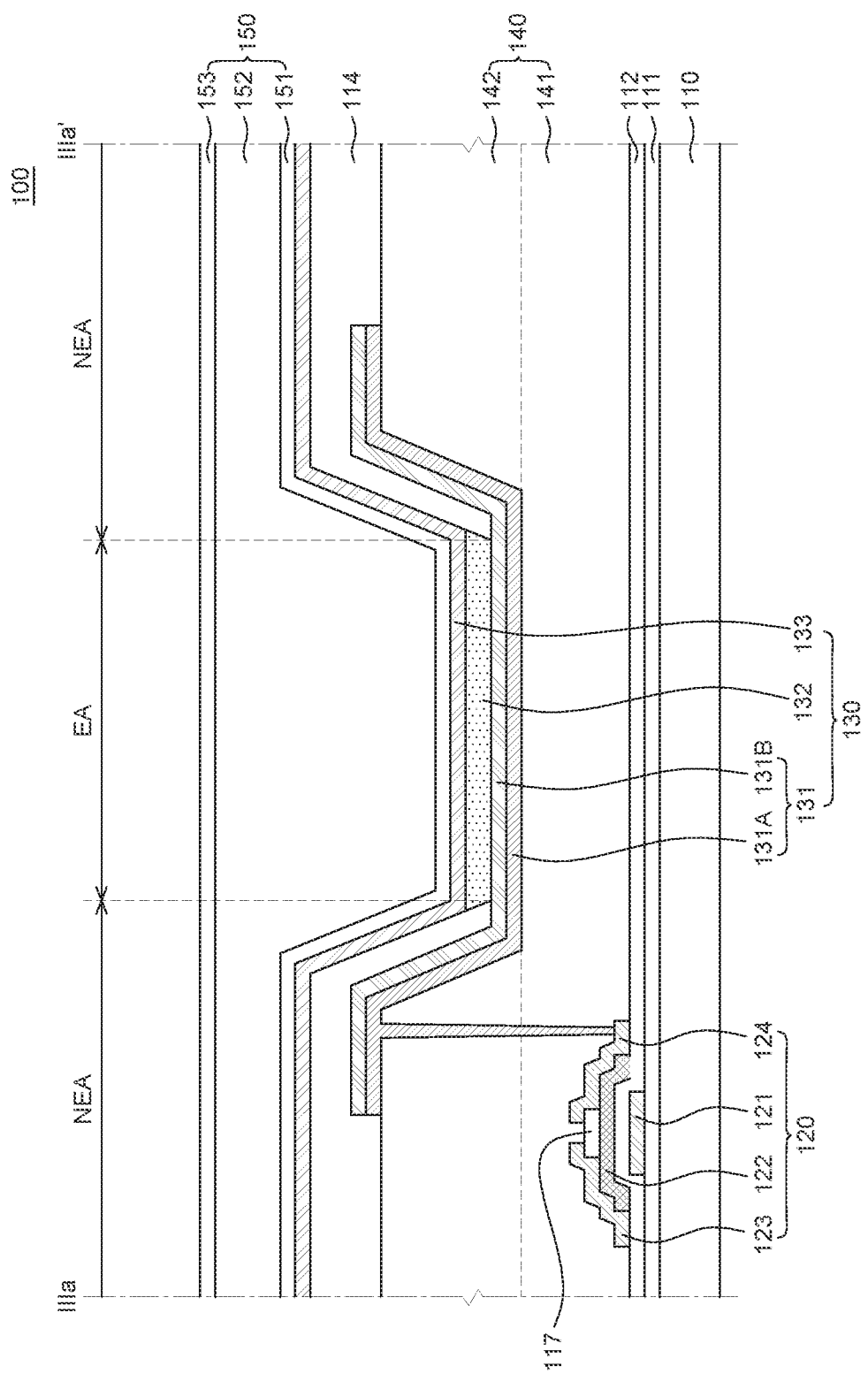
FIG. 3A is a cross-sectional view of the light emitting display apparatus, taken along line IIIa-IIIa' of FIG. 2.
Figure 3B:
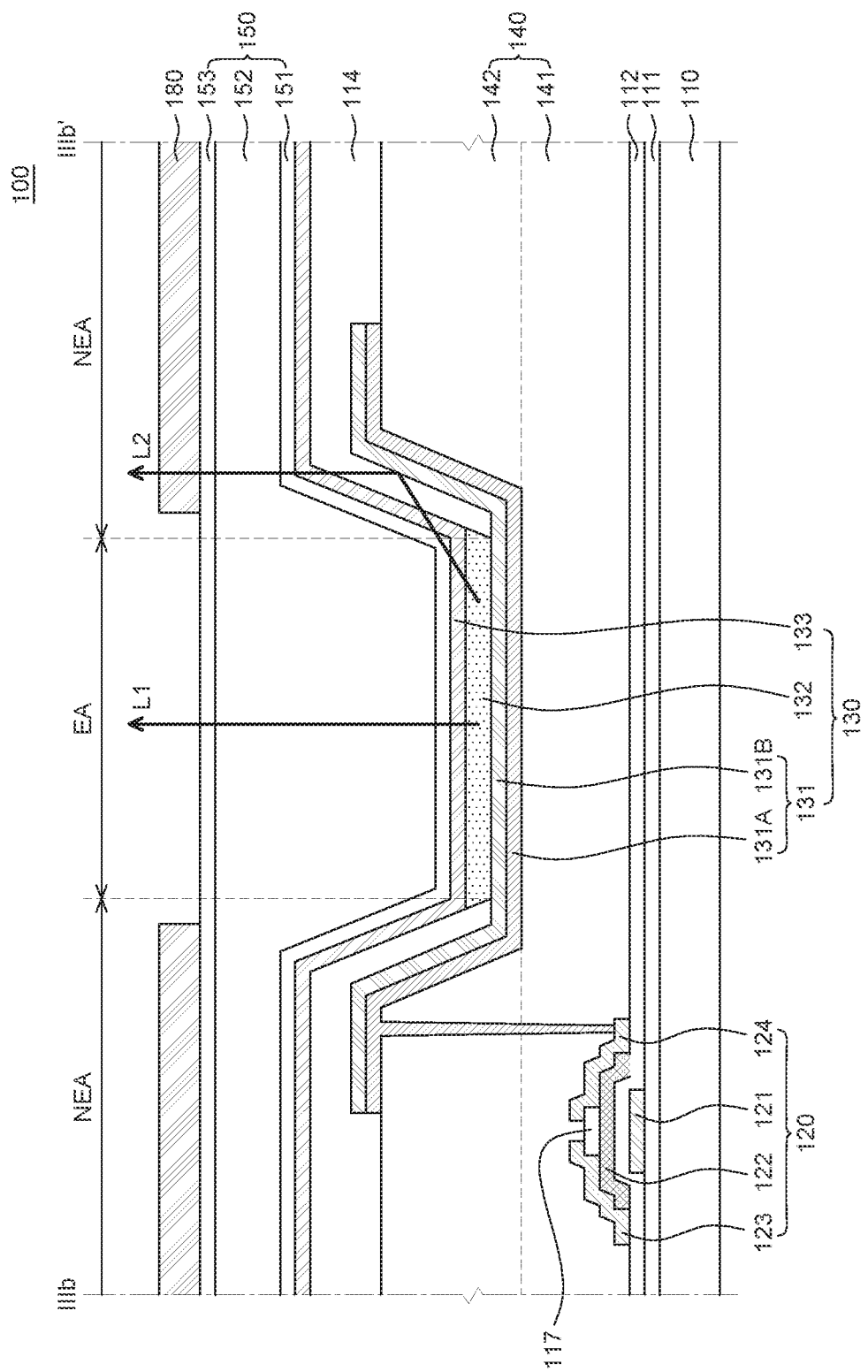
FIG. 3B is a cross-sectional view of the light emitting display apparatus, taken along line IIIb-IIIb' of FIG. 2.

FIG. 1 is a plan view of a light emitting display apparatus according to an exemplary embodiment of the present disclosure. FIG. 2 is an enlarged plan view of region 'A' of FIG. 1. FIG. 3A is a cross-sectional view of the light emitting display apparatus, taken along line IIIa-IIIa' of FIG. 2. FIG. 3B is a cross-sectional view of the light emitting display apparatus, taken along line IIIb-IIIb' of FIG. 2. In FIG. 2, only a plurality of sub-pixels SPX and a cut-off layer 180 are illustrated for convenience of description. In addition, FIG. 3A is a cross-sectional view for a first sub-pixel SPX1 and a second sub-pixel SPX2, and FIG. 3B is a cross-sectional view for a third sub-pixel SPX3. All components of the light emitting display apparatus according to all embodiments of the present disclosure are operatively coupled and configured.

With reference to FIG. 1 to FIG. 3, a light emitting display apparatus 100 can include a substrate 110, a thin film transistor 120, a light emitting element 130, an overcoating layer 140, a bank layer 114, a light emitting element, an encapsulation part, and a cut-off layer 180. The light emitting display apparatus 100 can be implemented as a top emission type light emitting display apparatus.

The substrate 110 includes a display area A/A and a non-display area N/A.

The display area A/A is an area where an image is displayed in the light emitting display apparatus 100. In the display area A/A, a display element and a variety of driving elements configured to drive the display element can be disposed. For example, the display element can be configured of a light emitting element including a first electrode 131, a light emitting layer, and a second electrode. In addition, various driving elements configured to drive the display element, such as a thin film transistor, a capacitor or wirings, can be disposed at the display area A/A.

The display area A/A can include a plurality of sub-pixels SPX. The sub-pixel SPX is a minimum unit for configuring a screen, and each of the plurality of sub-pixels SPX can include the light emitting element 130 and a driving circuit. Each of the plurality of sub-pixels SPX can emit different wavelengths of light. For example, the plurality of sub-pixels SPX can include a first sub-pixel SPX1 which is a red sub-pixel, a second sub-pixel SPX2 which is a green sub-pixel, and a third sub-pixel SPX3 which is a blue sub-pixel. However, embodiments are not limited thereto. For instance, the plurality of sub-pixels SPX can further include a white sub-pixel.

The driving circuit of the sub-pixels SPX is a circuit for controlling a driving of the light emitting element 130. For example, the driving circuit can be configured to include a thin film transistor and a capacitor, but embodiments are not limited thereto.

The non-display area N/A is an area where no image is displayed and various components configured to drive the plurality of sub-pixels SPX disposed in the display area A/A can be disposed. For example, a driver IC which supplies a signal for driving the plurality of sub-pixels SPX, a flexible film or the like can be disposed at the non-display area N/A.

The non-display area N/A can be an area surrounding the display area A/A as illustrated in FIG. 1, but embodiments are not limited thereto. For example, the non-display area N/A can be an area extending from the display area A/A.

With reference to FIGS. 3A and 3B, the substrate 110 can support and protect various components of the light emitting display apparatus 100. The substrate 110 can be formed of glass or a plastic material having flexibility. When the substrate 110 is formed of a plastic material, for example, it can be formed of polyimide (PI). However, embodiments of the present disclosure are not limited thereto.

A buffer layer 111 is disposed on the substrate 110. The buffer layer 111 can improve adhesion between layers formed on the buffer layer 111 and the substrate 110 and can block an alkali component or the like, flowing out of the substrate 110. The buffer layer 111 can be formed of a single layer of silicon nitride (SiNx) or silicon oxide (SiOx), or a multiple layer of silicon nitride (SiNx) or silicon oxide (SiOx), but embodiments are not limited thereto. The buffer layer 111 can be omitted based on a type and material of the substrate 110 and a structure and type of the thin film transistor 120.

The thin film transistor 120 is disposed on the substrate 110. The thin film transistor 120 can be a driving element of the light emitting display apparatus 100. The thin film transistor 120 includes a gate electrode 121, an active layer 122, a source electrode 123, and a drain electrode 124. In the light emitting display apparatus 100 according to an exemplary embodiment of the present disclosure, the thin film transistor 120 has a structure in which the active layer 122 is disposed on the gate electrode 121, and the source electrode 123 and the drain electrode 124 are disposed on the active layer 122. Therefore, the thin film transistor 120 has a bottom gate structure in which the gate electrode 121 is disposed in the lowermost portion, but embodiments are not limited thereto.

The gate electrode 121 of the thin film transistor 120 is disposed on the substrate 110. The gate electrode 121 can be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof, but embodiments are not limited thereto.

A gate insulating layer 112 is disposed on the gate electrode 121. The gate insulating layer 112 is a layer for electrically insulating the gate electrode 121 and the active layer 122 from each other and can be formed of an insulating material. For example, the gate insulating layer 112 can be formed of a single layer of silicon nitride (SiNx) or silicon oxide (SiOx) which is an inorganic material or a multiple layer of silicon nitride (SiNx) or silicon oxide (SiOx), but embodiments are not limited thereto.

The active layer 122 is disposed on the gate insulating layer 112. The active layer 122 is disposed to overlap the gate electrode 121. For example, the active layer can be formed of an oxide semiconductor or formed of amorphous silicon (a-Si), polycrystalline silicon (poly-Si), an organic semiconductor or the like.

An etch stopper 117 is disposed on the active layer 122. The etch stopper 117 prevents damage to the surface of the active layer 122 due to plasma when the source electrode 123 and the drain electrode 124 are patterned by an etching method. One portion of the etch stopper 117 can overlap the source electrode 123, and the other portion of the etch stopper 117 can overlap the drain electrode 124. However, the etch stopper 117 can be omitted.

The source electrode 123 and the drain electrode 124 are disposed on the active layer 122 and the etch stopper 117. The source electrode 123 and the drain electrode 124 are disposed on the same layer and are spaced apart from each other. The source electrode 123 and the drain electrode 124 can be electrically connected to the active layer 122 to be in contact with the active layer 122. The source electrode 123 and the drain electrode 124 can be formed of any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof, but embodiments are not limited thereto.

The overcoating layer 140 is disposed on the thin film transistor 120. The overcoating layer 140 can protect the thin film transistor 120 and smooth steps of layers disposed on the substrate 110. The overcoating layer 140 can be formed of one of acrylic-based resin, epoxy resin, phenol resin, polyamide-based resin, polyimide-based resin, unsaturated polyester-based resin, polyphenylene-based resin, polyphenylene sulfide-based resin, benzocyclobutene, and photoresist, but embodiments are not limited thereto.

The overcoating layer 140 includes a base portion 141 and a protrusion portion 142. The base portion 141 and the protrusion portion 142 can be integrally formed as illustrated in FIGS. 3A and 3B. For example, the base portion 141 and the protrusion portion 142 can be formed of the same material and formed simultaneously by a same process, for example, a mask process, but embodiments are not limited thereto.

The base portion 141 is disposed on the thin film transistor 120. An upper surface of the base portion 141 has a surface parallel to the substrate 110. Accordingly, the base portion 141 can planarize a step difference that can be caused by components disposed thereunder.

The protrusion portion 142 is disposed on the base portion 141. The protrusion portion 142 is integrally formed with the base portion 141 and is formed to protrude from the base portion 141. Thus, an upper surface of the protrusion portion 142 can be smaller than a lower surface thereof. However, embodiments are not limited thereto.

The protrusion portion 142 includes the upper surface and a side portion. The upper surface of the protrusion portion 142 can be a surface at the uppermost of the protrusion portion 142 and can be a surface substantially parallel to the base portion 141 or the substrate 110. The side portion of the protrusion portion 142 can be a surface connecting the upper surface of the protrusion portion 142 and the base portion 141.

FIGS. 3A and 3B illustrate that the overcoating layer 140 includes the base portion 141 having a planar upper surface and the protrusion portion 142 protruding from the base portion 141. However, as long as the overcoating layer 140 has a shape in which the base portion 141 and the protrusion portion 142 are embodied, a detailed configuration of the overcoating layer 140 is not limited to the base portion 141 and the protrusion portion 142, and can be variously implemented.

The light emitting element 130 is disposed on the overcoating layer 140. The light emitting element 130 includes the first electrode 131, a light emitting layer 132, and a second electrode 133.

The first electrode 131 is disposed on the overcoating layer 140 to cover the base portion 141 and the side portion of the protrusion portion 142. For example, the first electrode 131 is disposed on some portion among the upper surface of the base portion 141 on which the protrusion portion 142 is not disposed, a side surface of the protrusion portion 142, and a portion of an upper surface of the protrusion portion 142. And the first electrode 131 is disposed along shapes of the base portion 141 and the protrusion portion 142. However, embodiments are not limited thereto, and the first electrode 131 can be disposed only on the upper surface of the base portion 141 and the side surface of the protrusion portion 142.

The first electrode 131 includes a reflective layer 131A electrically connected to the thin film transistor 120 and a transparent conductive layer 131B on the reflective layer 131A.

The reflective layer 131A of the first electrode 131 is disposed on the overcoating layer 140. Since the light emitting display apparatus 100 according to an exemplary embodiment of the present disclosure is a top emission type light emitting display apparatus, the reflective layer 131A can reflect light emitted from the light emitting element 130 upwardly. Light generated from the light emitting layer 132 of the light emitting element 130 may not be emitted only upwardly, but can also be emitted laterally. The light emitted laterally can be directed to the inside of the light emitting display apparatus 100, can be trapped inside the light emitting display apparatus 100 by total reflection, and can travel and be extinguished in an inward direction of the light emitting display apparatus 100. Accordingly, the reflective layer 131A is disposed under the light emitting layer 132 and is disposed to cover the side portion of the protrusion portion 142, whereby a traveling direction of the light traveling toward a side portion of the light emitting layer 132 can be changed to a front direction.

The reflective layer 131A can be formed of a metal material, and for example, can be formed of a metal material such as aluminum (Al), silver (Ag), copper (Cu), or magnesium-silver alloy (Mg:Ag), but embodiments are not limited thereto. The reflective layer 131A can be electrically connected to the drain electrode 124 through a contact hole formed in the overcoating layer 140. And embodiments are not limited thereto, and the reflective layer 131A can be electrically connected to the source electrode 123 through the contact hole formed in the overcoating layer 140.

The transparent conductive layer 131B is disposed on the reflective layer 131A. The transparent conductive layer 131B is disposed on the reflective layer 131A and is electrically connected to the drain electrode 124 through the reflective layer 131A. The transparent conductive layer 131B can be formed of a conductive material having a high work function to supply holes to the light emitting layer 132. For example, the transparent conductive layer 131B can be formed of a transparent conductive oxide such as indium tin oxide (ITO), indium zinc oxide (IZO), indium tin zinc oxide (ITZO), zinc oxide (ZnO), and tin oxide (TO), but embodiments are not limited thereto.

A bank layer 114 is disposed on the first electrode 131 and the overcoating layer 140. The bank layer 114 can cover a portion of the first electrode 131 of the light emitting element 130 in the plurality of sub-pixels SPX, and define a light emitting area EA and a non-light emitting area NEA. For example, in the non-light emitting area NEA, the bank layer 114 can be disposed on the first electrode 131 to block generation of light in the non-light emitting area NEA. Since the bank layer 114 is not disposed in the light emitting area EA, the light emitting layer 132 can be directly positioned on the first electrode 131, whereby light can be generated from the light emitting layer 132.

The bank layer 114 can be formed of an organic material or inorganic material. For example, the bank layer 114 can be formed of an organic material such as polyimide, acrylic, or benzocyclobutene-based resin, or can be formed of an inorganic material such as silicon nitride (SiNx) or silicon oxide (SiOx), but embodiments are not limited thereto.

The light emitting layer 132 is disposed to contact the first electrode 131 at the plurality of sub-pixels SPX. For example, the light emitting layer 132 can be disposed at the light emitting area EA on the first electrode 131. For example, the light emitting layer 132 can be disposed to be surrounded by the bank layer 114.

The light emitting layer 132 is a layer for emitting light of a specific color and has a structure separated for each sub-pixel SPX. For example, the light emitting layer 132 disposed in the first sub-pixel SPX1 which is a red sub-pixel is a red light emitting layer, the light emitting layer 132 disposed in the second sub-pixel SPX2 which is a green sub-pixel is a green light emitting layer, and the light emitting layer 132 disposed in the third sub-pixel SPX3 which is a blue sub-pixel is a blue light emitting layer. The light emitting layer 132 disposed in the first sub-pixel SPX1, the light emitting layer 132 disposed in the second sub-pixel SPX2, and the light emitting layer 132 disposed in the third sub-pixel SPX3 can be separately disposed. Each light emitting layer 132 can be pattern-deposited in each light emitting area EA by a mask opened for each sub-pixel SPX, for example, a fine metal mask (FMM). The light emitting layer 132 can further include various layers such as a hole transporting layer, a hole injection layer, a hole blocking layer, an electron injection layer, an electron blocking layer, an electron transporting layer and the like. In addition, the light emitting layer 132 can be an organic light emitting layer formed of an organic material, but embodiments are not limited thereto. For example, the light emitting layer 132 can be formed of a quantum dot light emitting layer or a micro-LED.

The second electrode 133 is disposed on the light emitting layer 132 and the bank layer 114 in the sub-pixel SPX. For example, the second electrode 133 is disposed to contact the light emitting layer 132 in the light emitting area EA and can be disposed along a shape of the light emitting layer 132. In addition, the second electrode 133 can be disposed to contact the bank layer 114 in the non-light emitting area NEA and can be disposed along a shape of the bank layer 114.

The second electrode 133 supplies electrons to the light emitting layer 132. The second electrode 133 can be formed of a metal material such as silver (Ag), copper (Cu), and a magnesium-silver alloy (Mg:Ag), but embodiments are not limited thereto. When the second electrode 133 is formed of a metal material, it has a very low refractive index. For example, when silver (Ag) is used as the second electrode 133, the refractive index of the second electrode 133 can be about 0.13.

Since the light emitting display apparatus 100 according to an exemplary embodiment of the present disclosure is a top emission type light emitting display apparatus, it can be manufactured such that a micro-cavity is implemented. For example, in the light emitting display apparatus 100 according to an exemplary embodiment of the present disclosure, constructive interference of light emitted from the light emitting layer 132 can be implemented by adjusting a distance between the reflective layer 131A and the second electrode 133, thereby enhancing light efficiency. Accordingly, in the light emitting display apparatus 100 according to an exemplary embodiment of the present disclosure, a micro-cavity can be implemented by differently configuring a thickness value of the light emitting layer 132 for each sub-pixel SPX.

With reference to FIGS. 3A and 3B, an encapsulation part 150 is disposed on the second electrode 133. The encapsulation part 150 is disposed on the overcoating layer 140 and the light emitting element 130. The encapsulation part 150 can block oxygen and moisture penetrating into an inside of the light emitting display apparatus 100 from the outside thereof. For example, when the light emitting display apparatus 100 is exposed to moisture or oxygen, a pixel shrinkage phenomenon in which the light emitting area is reduced can occur, or a problem that a black spot occurs in the light emitting area can be caused. Accordingly, the encapsulation part 150 can block oxygen and moisture to protect the light emitting display apparatus 100.

The encapsulation part 150 includes a first encapsulation layer 151, a second encapsulation layer 152, and a third encapsulation layer 153.

The first encapsulation layer 151 is disposed on the second electrode 133 to inhibit or prevent the penetration of moisture or oxygen. The first encapsulation layer 151 can be formed of an inorganic material such as silicon nitride (SiNx), silicon oxynitride (SiNxOy), aluminum oxide (AlyOz) or the like, but embodiments are not limited thereto. The first encapsulation layer 151 can be formed of a material having a refractive index greater than a refractive index of the second encapsulation layer 152. For example, when the first encapsulation layer 151 is formed of silicon nitride (SiNx) or silicon oxynitride (SiNxOy), a refractive index of the first encapsulation layer 151 can be about 1.8.

The second encapsulation layer 152 is disposed on the first encapsulation layer 151 to planarize a surface thereof. In addition, the second encapsulation layer 152 can cover foreign matter or particles that can occur in a manufacturing process. The second encapsulation layer 152 can be formed of an organic material, for example, silicon oxycarbon (SiOxCz), acrylic or epoxy-based resin or the like, but embodiments are not limited thereto. The second encapsulation layer 152 can be formed of a material having a refractive index less than a refractive index of the first encapsulation layer 151. For example, when the second encapsulation layer 152 is an acrylic-based resin, the refractive index of the second encapsulation layer 152 can be about 1.5 to about 1.6.

The third encapsulation layer 153 is disposed on the second encapsulation layer 152, and similarly to the first encapsulation layer 151, it can inhibit the penetration of moisture or oxygen. The third encapsulation layer 153 can be formed of an inorganic material such as silicon nitride (SiNx), silicon oxynitride (SiNxOy), silicon oxide (SiOx), aluminum oxide (AlyOz) or the like, but embodiments are not limited thereto. The third encapsulation layer 153 can be formed of a same material as or a different material from the first encapsulation layer 151.

In related art light emitting display apparatuses, light trapped and lost inside the light emitting display apparatus, of the light emitted from the light emitting layer, has become a factor in lowering light efficiency. For example, in the light emitted from the light emitting layer, there occurs light that may not be extracted to the outside of the light emitting display apparatus due to a total reflection loss or an optical waveguide loss, so that a light extraction efficiency of the light emitting display apparatus is degraded. For example, in related art light emitting display apparatuses, since a first electrode formed on an overcoating layer having a planar upper surface is used, light emitted at a low emission angle, among the light emitted from the light emitting layer, can be trapped in the light emitting display apparatuses.

Accordingly, the light emitting display apparatus 100 according to an exemplary embodiment of the present disclosure can improve a light extraction efficiency of the light emitting element 130 by the overcoating layer 140 having the protrusion portion 142. For example, in the light emitting display apparatus 100 according to an exemplary embodiment of the present disclosure, the overcoating layer 140 is configured to include the base portion 141 and the protrusion portion 142 protruding from the base portion 141, and the reflective layer 131A of the first electrode 131 of the light emitting element 130 is disposed to cover the base portion 141 and at least the side surface of the protrusion portion 142. Therefore, second light L2 emitted at a low emission angle, of the light emitted from the light emitting layer 132 of the light emitting display apparatus 100, can be extracted in a front direction by the reflective layer 131A disposed on the side portion of the protrusion portion 142. For example, when a first electrode is disposed on an overcoating layer having a planar shape as in related art light emitting display apparatuses, laterally directed light, for example, light emitted at a low emission angle does not travel in the front direction and may not be extracted to the outside of the light emitting display apparatus due to a total reflection loss or an optical waveguide loss. However, in the light emitting display apparatus 100 according to an exemplary embodiment of the present disclosure, the second light L2 emitted at a low emission angle from the light emitting layer 132, together with the first light L1 emitted from the light emitting layer 132 in the front direction, is reflected from the reflective layer 131A disposed on the side portion of the protrusion portion 142, and can be extracted in the front direction. Accordingly, in the light emitting display apparatus 100 according to an exemplary embodiment of the present disclosure, the reflective layer 131A disposed on a side portion of the overcoating layer 140 functions as a side mirror, such that light to be lost within the light emitting display apparatus 100 can be extracted in the front direction, thereby enhancing light extraction efficiency and power consumption.

The first light L1 emitted from the light emitting layer 132 in the front direction is emitted while having an electroluminescence (EL) spectrum and implementing a micro-cavity. On the other hand, the second light L2 which is emitted at a low emission angle from the light emitting layer 132, reflected from the reflective layer 131A disposed on the side portion of the protrusion portion 142, and then, extracted in the front direction can have PL characteristics. Due to additionally extracted light by the second light L2, light emitted outwardly of the light emitting display apparatus 100 can have a higher increase rate in a long wavelength region, than in a short wavelength region In this case, in the first sub-pixel SPX1 which is a red sub-pixel, since red light emitted from the red sub-pixel has a long wavelength, the first light L1 and the second light L2 are extracted from the first sub-pixel SPX1 and thus, color gamut or color reproduction rate can be further enhanced.

In addition, in the second sub-pixel SPX2 which is a green sub-pixel, a change in color coordinates can be caused due to a high increase rate of light extracted in a long wavelength region by the second light L2. However, in general, since the efficiency of a material used as a light emitting layer for emitting green light is superior to those of light emitting layers for emitting light of other colors, the intensity in the entire wavelength region can be reduced to remove the increasing amount of light in the long wavelength region, thereby preventing a change in color coordinates.

Next, in the third sub-pixel SPX3 which is a blue sub-pixel, since an increase rate of light extracted in the long wavelength region by the second light L2 is high, a color coordinate change can occur. In addition, in general, the efficiency of a material used as a light emitting layer for emitting blue light is very lower than those of light emitting layers for emitting light of other colors. Accordingly, in the third sub-pixel SPX3, in a case in which the intensity in the entire wavelength region is reduced to remove the increasing amount of light in the long wavelength region in the same manner as the second sub-pixel SPX2, light efficiency improved by implementing the micro-cavity is reduced again, and color coordinate abnormality can occur.

Accordingly, in the light emitting display apparatus 100 according to an exemplary embodiment of the present disclosure, the cut-off layer 180 is disposed on the encapsulation part 150 in the third sub-pixel SPX3 which is the blue sub-pixel among the plurality of sub-pixels, thereby minimizing a color coordinate change that can occur in the third sub-pixel SPX3 by the second light L2.

With reference to FIG. 3B, the cut-off layer 180 is disposed on the encapsulation part 150. The cut-off layer 180 is configured to transmit blue light and cuts off light having a wavelength longer than a wavelength of blue light, thereby functioning as a layer that inhibits or prevents a color coordinate change. For example, the cut-off layer 180 can be a blue color filter that passes only blue light therethrough, but embodiments are not limited thereto. For example, the cut-off layer 180 can be a blue color filter disposed on an upper surface of the encapsulation part 150. Also, the cut-off layer 180 can be disposed at the non-light emitting area NEA. In FIG. 2 and FIG. 3B, the cut-off layer 180 is illustrated as being disposed at a portion of the non-light emitting area NEA, but embodiments are not limited thereto. The cut-off layer 180 is disposed at the entirety of the non-light emitting area NEA.

In the light emitting display apparatus 100 according to an exemplary embodiment of the present disclosure, with the cut-off layer 180 disposed at the non-light emitting area NEA, a color coordinate change caused by the second light L2 emitted through the non-light emitting area NEA can be inhibited, while maintaining high light efficiency implemented by the micro-cavity in the light emitting area EA. If the cut-off layer 180 is disposed at the light emitting area EA, the efficiency of the first light L1 emitted through the light emitting area EA by the cut-off layer 180 can be reduced. For example, when the cut-off layer 180 is a blue color filter, the blue color filter can have a transmittance of less than about 80% in a main wavelength range of blue light, for example, in a wavelength range of 440 nm to 480 nm. Accordingly, when the cut-off layer 180 is disposed at the light emitting area EA, a basic emission efficiency of the first light L1 decreases, which can be a problem in terms of light efficiency. Thus, in the light emitting display apparatus 100 according to an exemplary embodiment of the present disclosure, the cut-off layer 180 is disposed at the non-light emitting area NEA, so that high light efficiency of the first light L1 emitted from the light emitting area EA can be maintained. In addition, the second light L2 which is emitted at a low emission angle from the light emitting layer 132, reflected from the reflective layer 131A disposed on the side portion of the protrusion portion 142, and then, extracted in the front direction through the non-light emitting area NEA, passes through the cut-off layer 180, whereby a color coordinate change can be inhibited or prevented, and color gamut or color reproduction rate can be improved. The cut-off layer 180 can be a color coordinate change inhibiting or prevention layer or a wavelength inhibiting or prevention layer, but embodiments are not limited to the terms.

Figure 4:
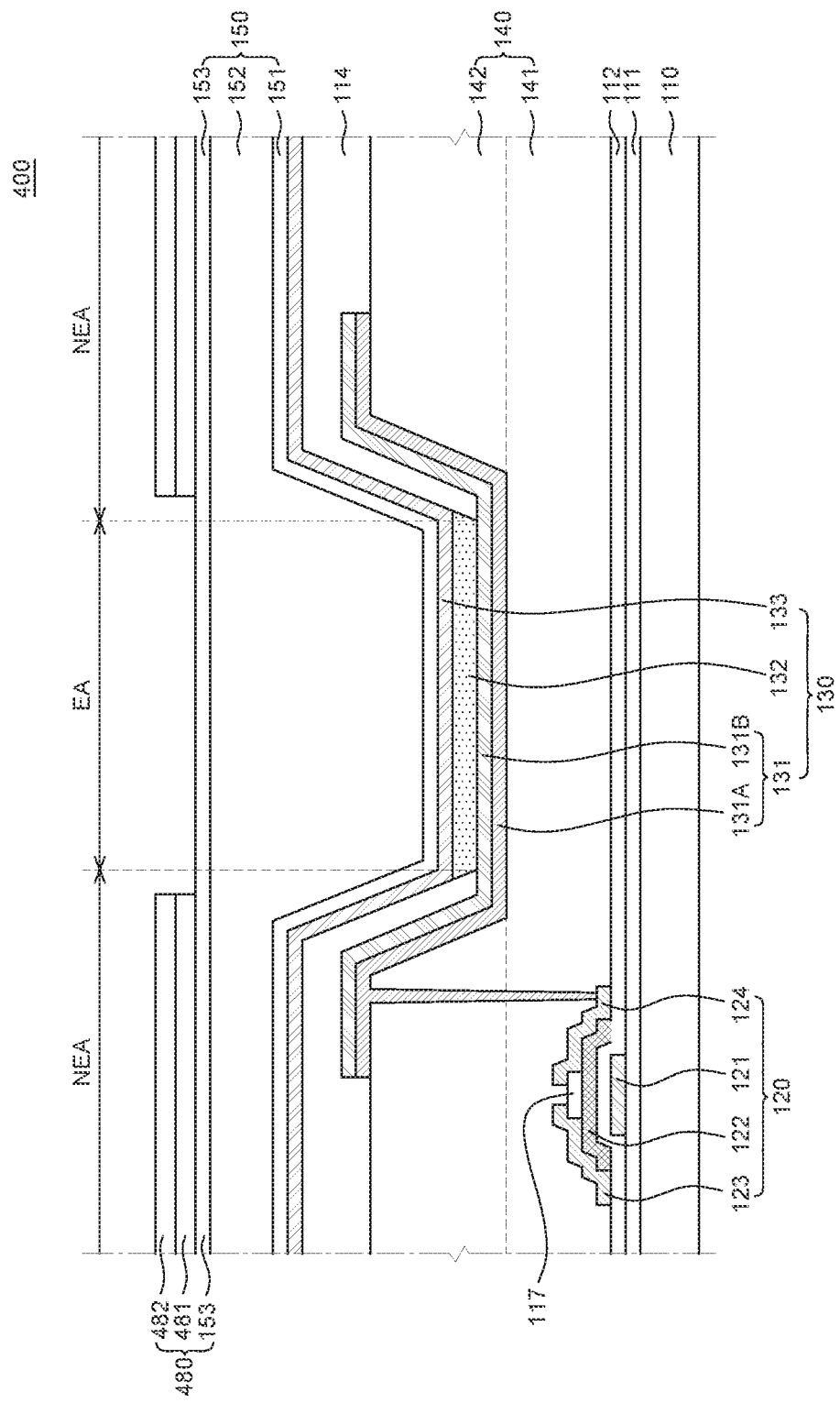
FIG. 4 is a cross-sectional view of a light emitting display apparatus according to another exemplary embodiment of the present disclosure.

FIG. 4 is a cross-sectional view of a light emitting display apparatus according to another exemplary embodiment of the present disclosure. A light emitting display apparatus 400 of FIG. 4 is different from the light emitting display apparatus 100 of FIGS. 1 to 3B in terms of a cut-off layer 480, but other configurations thereof are substantially the same as those of the light emitting display apparatus 100 of FIGS. 1 to 3B. Thus, a redundant description will be omitted or will be brief.

With reference to FIG. 4, the cut-off layer 480 is disposed at the non-light emitting area NEA. The cut-off layer 480 is configured to transmit blue light, and can be a layer that cuts off light having a wavelength longer than a wavelength of blue light to inhibit or prevent a color coordinate change. The cut-off layer 480 can be a color coordinate change inhibiting or prevention layer or a wavelength inhibiting or prevention layer, but embodiments are not limited to the terms. In FIG. 4, the cut-off layer 480 is illustrated as being disposed at a portion of the non-light emitting area NEA, but embodiments are not limited thereto. The cut-off layer 480 can be disposed at the entirety of the non-light emitting area NEA.

The cut-off layer 480 includes a third encapsulation layer 153, a first inorganic insulating layer 481 and a second inorganic insulating layer 482. The third encapsulation layer 153 can be a lower inorganic insulating layer, and the second inorganic insulating layer 482 can be an upper inorganic insulating layer. The first inorganic insulating layer 481 can be an intermediate inorganic insulating layer. The third encapsulation layer 153 can be an uppermost inorganic insulating layer of the encapsulation part 150. In other words, the cut-off layer 480 may be formed with the third encapsulation layer 153 of the encapsulation part 150 (e.g., a portion of the third encapsulation layer 153 overlapping the bank layer 114), and the first inorganic insulating layer 481 and the second inorganic insulating layer 482 which are additionally formed on the third encapsulation layer 153.

The first inorganic insulating layer 481 is disposed on the encapsulation part 150. The first inorganic insulating layer 481 is disposed on the third encapsulation layer 153 of the encapsulation part 150 to be in contact therewith. The first inorganic insulating layer 481 can be disposed at a portion of the non-light emitting area NEA, as illustrated in FIG. 4, but embodiments are not limited thereto. The first inorganic insulating layer 481 can be disposed at the entirety of the non-light emitting area NEA. Also, the first inorganic insulating layer 481 can be disposed to overlap a portion of the bank layer 114. The first inorganic insulating layer 481 can be formed of an inorganic insulating material. The first inorganic insulating layer 481 can be formed of an inorganic insulating material such as silicon oxide (SiOx), but is not limited thereto. The first inorganic insulating layer 481 can be formed of a material having a refractive index lower than that of the third encapsulation layer 153. For example, when silicon oxide (SiOx) is used as the first inorganic insulating layer 481, the refractive index of the first inorganic insulating layer 481 can be about 1.4 to about 1.5. However, embodiments of the present disclosure are not limited thereto, and as long as the refractive index of the first inorganic insulating layer 481 is less than the refractive index of the third encapsulation layer 153, a material for configuring the first inorganic insulating layer 481 is not necessarily limited to inorganic materials.

The second inorganic insulating layer 482 is disposed on the first inorganic insulating layer 481. The second inorganic insulating layer 482 is disposed to have a same size as the first inorganic insulating layer 481 and can be disposed at a portion of the non-light emitting area NEA. However, embodiments of the present disclosure are not limited thereto, and the second inorganic insulating layer 482 can be disposed at the entirety of the non-light emitting area NEA. The second inorganic insulating layer 482 can be formed of a material having the same refractive index as the third encapsulation layer 153. For example, the second inorganic insulating layer 482 can be formed of an inorganic material such as silicon nitride (SiNx), silicon oxynitride (SiOxNy), or the like. When silicon nitride (SiNx) is disposed as the third encapsulation layer 153, the second inorganic insulating layer 482 can also be formed of silicon nitride (SiNx) and have a refractive index of about 1.8. However, as long as the second inorganic insulating layer 482 has the same refractive index as the third encapsulation layer 153, a material for configuring the second inorganic insulating layer 482 is not necessarily limited to inorganic materials.

In the light emitting display apparatus 400 according to another exemplary embodiment of the present disclosure, with the cut-off layer 480 disposed at the non-light emitting area NEA, a color coordinate change caused by light emitted through the non-light emitting area NEA can be inhibited, while maintaining high light efficiency implemented by the micro-cavity in the light emitting area EA. If the cut-off layer 480 is disposed at the light emitting area EA, the efficiency of light emitted through the light emitting area EA can be reduced by the cut-off layer 180. Therefore, in the light emitting display apparatus 400 according to another exemplary embodiment of the present disclosure, the cut-off layer 480 is disposed at the non-light emitting area NEA, so that high light efficiency of light emitted from the light emitting area EA can be maintained. In addition, light which is emitted at a low emission angle from the light emitting layer 132, reflected from the reflective layer 131A disposed on the side portion of the protrusion portion 142, and then, extracted in the front direction through the non-light emitting area NEA, passes through the cut-off layer 180, and accordingly, a color coordinate change can be inhibited or prevented and color gamut or color reproduction rate can be improved.

The cut-off layer 480 forms an interface where a difference in refractive index occurs by a stacked structure of layers having different refractive indices, and can adjust transmittance of light having a specific wavelength by constructive interference and offset interference due to reflection at the interface. In this case, when thicknesses of the third encapsulation layer 153, the first inorganic insulating layer 481, and the second inorganic insulating layer 482 configuring the cut-off layer 480 are thin, constructive interference and offset interference occur differently for each wavelength, thereby causing a photonic band gap where transmittance is lowered in a specific wavelength region. Accordingly, in the light emitting display apparatus 400 according to another exemplary embodiment of the present disclosure, by adjusting the thickness of the first inorganic insulating layer 481 between the third encapsulation layer 153 and the second inorganic insulating layer 482, a wavelength region in which constructive interference and offset interference occur by reflection at an interface between the third encapsulation layer 153 and the first inorganic insulating layer 481 and at an interface between the first inorganic insulating layer 481 and the second inorganic insulating layer 482 can be adjusted, and for example, the transmittance of light of a wavelength different from a wavelength of blue light can be lowered. The thicknesses of the third encapsulation layer 153, the first inorganic insulating layer 481, and the second inorganic insulating layer 482 will be described in detail with reference to FIG. 9.

In FIG. 4, the third encapsulation layer 153 of the encapsulation part 150 is described as functioning as the cut-off layer 480, but embodiments are not limited thereto. The cut-off layer 480 can be formed separately from the encapsulation part 150. For example, the cut-off layer 480 can be formed to have a structure in which an inorganic insulating layer having a high refractive index, an inorganic insulating layer having a low refractive index, and an inorganic insulating layer having a high refractive index are stacked on the encapsulation part 150.

Figure 5:
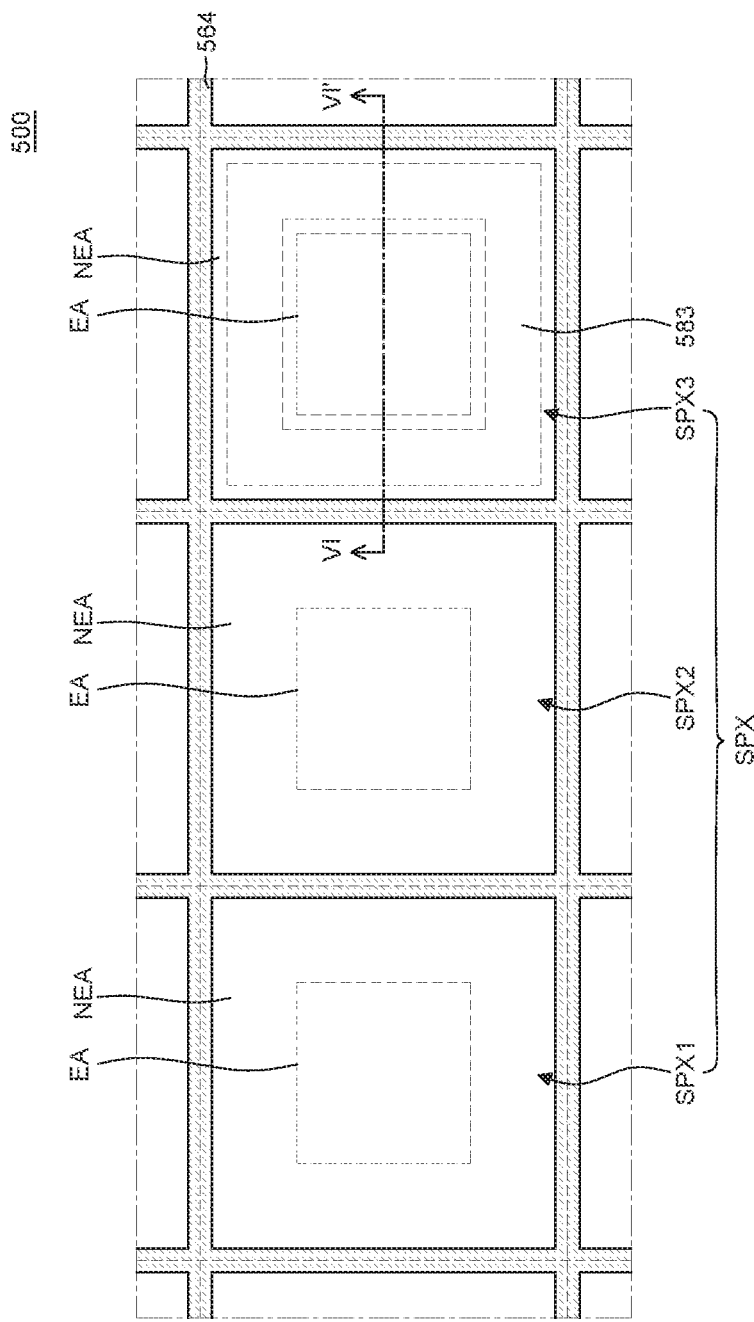
FIG. 5 is a plan view of a light emitting display apparatus according to another exemplary embodiment of the present disclosure.
Figure 6:
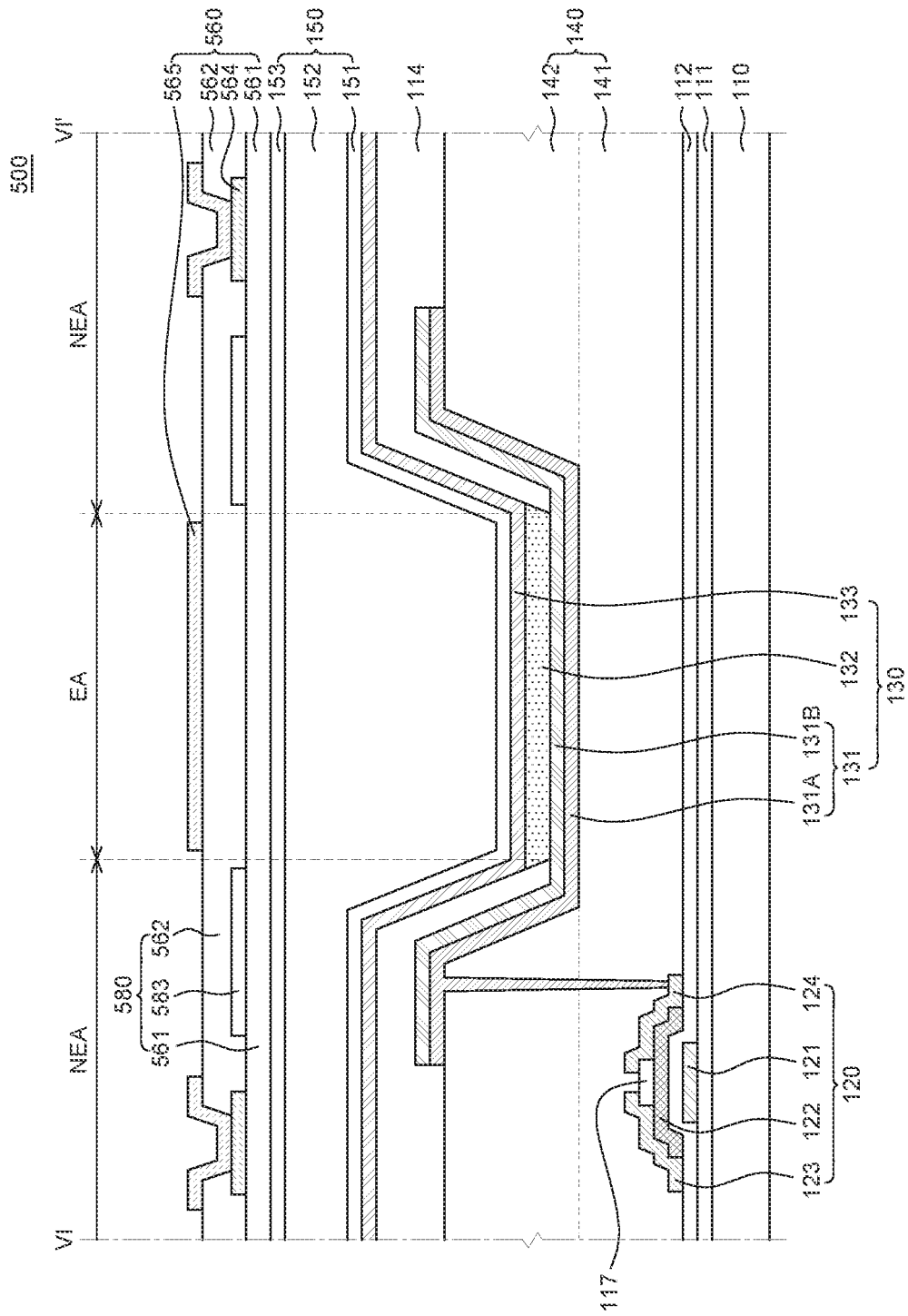
FIG. 6 is a cross-sectional view of the light emitting display apparatus, taken along line VI-VI' of FIG. 5.

FIG. 5 is a plan view of a light emitting display apparatus according to another exemplary embodiment of the present disclosure. FIG. 6 is a cross-sectional view of the light emitting display apparatus, taken along line VI-VI' of FIG. 5. In the light emitting display apparatus 500 of FIGS. 5 and 6, a touch part 560 is additionally provided and a cut-off layer 580 is different from that of the light emitting display device 100 of FIGS. 2 and 3, but other configurations are substantially the same as those of the light emitting display device 100 of FIGS. 2 and 3. Thus, a redundant description will be omitted or will be brief. In FIG. 5, only a plurality of sub-pixels SPX, a touch line 564, and a second inorganic insulating layer 562 are illustrated for convenience of description.

With reference to FIGS. 5 and 6, the touch part 560 is disposed on the encapsulation part 150. The touch part 560 is disposed at the display area A/A including the light emitting element 130 to sense a touch input. The touch part 560 can detect information of external touch using a user's finger or a touch pen. The touch part 560 includes a first inorganic insulating layer 561, the second inorganic insulating layer 562, the touch line 564, and a touch electrode 565.

The first inorganic insulating layer 561 is disposed on the encapsulation part 150. The first inorganic insulating layer 561 is disposed on the third encapsulation layer 153 of the encapsulation part 150 to be in contact therewith. The first inorganic insulating layer 561 can be formed of an inorganic material. For example, the first inorganic insulating layer 561 can be formed of an inorganic material such as silicon nitride (SiNx), silicon oxynitride (SiOxNy), or the like. For example, silicon nitride (SiNx) is used as the first inorganic insulating layer 561, a refractive index of the first inorganic insulating layer 561 can be about 1.8. The touch line 564 is disposed on the first inorganic insulating layer 561. The touch line 564 is disposed at the non-light emitting area NEA on the first inorganic insulating layer 561. The touch line 564 can be disposed in a row direction or a column direction. The touch line 564 supplies a touch driving signal for driving the touch part 560. Also, the touch line 564 can transmit touch information sensed by the touch part 560 to a driver IC.

The second inorganic insulating layer 562 is disposed on the touch line 564 and the first inorganic insulating layer 561. The second inorganic insulating layer 562 can be disposed on the first inorganic insulating layer 561 and the touch line 564 to planarize an upper surface thereof. The second inorganic insulating layer 562 can prevent a short-circuit of the touch line 564 which is disposed to be adjacent thereto. The second inorganic insulating layer 562 can be formed of the same material as the first inorganic insulating layer 561. For example, the second inorganic insulating layer 562 can be formed of an inorganic material such as silicon nitride (SiNx), silicon oxynitride (SiOxNy) or the like. For example, when silicon nitride (SiNx) is used as the second inorganic insulating layer 562, a refractive index of the second inorganic insulating layer 562 can be about 1.8. However, as long as the second inorganic insulating layer 562 has the same refractive index as the first inorganic insulating layer 561, a material for configuring the second inorganic insulating layer 562 is not limited thereto.

The touch electrode 565 is disposed on the touch line 564 and the second inorganic insulating layer 562. The touch electrode 565 can be disposed in a row direction and a column direction. For example, the touch electrode 565 which is disposed in any one of the row direction or the column direction can be disposed on the touch line 564. The touch electrode 565 which is disposed in the other of the row direction or the column direction can be disposed on the second inorganic insulating layer 562. The touch electrodes 565 disposed in the column direction and the touch electrodes 565 disposed in the row direction can be connected to each other through a bridge electrode and have a mesh-like structure. In FIG. 6, the touch electrode 565 is illustrated as being disposed in the light emitting area EA, but the touch electrode 565 may not be disposed in the light emitting area EA, and embodiments are not limited thereto.

With reference to FIG. 6, the cut-off layer 580 is disposed on the encapsulation part 150. The cut-off layer 580 is configured to transmit blue light and cuts off light having a wavelength longer than a wavelength of blue light, thereby functioning as a layer that inhibits a color coordinate change. The cut-off layer 580 can be a color coordinate change inhibiting or prevention layer or a wavelength inhibiting or prevention layer, but embodiments are not limited to the terms. The cut-off layer 580 includes a third inorganic insulating layer 583, together with the first inorganic insulating layer 561 and the second inorganic insulating layer 562 that are part of the components of the touch part 560. The first inorganic insulating layer 561 can be a lower inorganic insulating layer, and the second inorganic insulating layer 562 can be an upper inorganic insulating layer. The third inorganic insulating layer 583 can be an intermediate inorganic insulating layer. The first inorganic insulating layer 561 can be disposed on the third encapsulation layer 153 of the encapsulation part 150. In other words, the cut-off layer may 580 be formed with portions of the first inorganic insulating layer 561 and the second inorganic insulating layer 562 of the touch part 560 that overlap the bank layer 114, and the third inorganic insulating layer 583 that is additionally formed between the first inorganic insulating layer 561 and the second inorganic insulating layer 562 and overlaps the bank layer 114.

The first inorganic insulating layer 561 is disposed on the upper surface of the encapsulation part 150. The third inorganic insulating layer 583 is disposed between the first inorganic insulating layer 561 and the second inorganic insulating layer 562. The third inorganic insulating layer 583 is disposed at the non-light emitting area NEA as illustrated in FIG. 6. Also, the third inorganic insulating layer 583 can be disposed to overlap a portion of the bank layer 114 and can be disposed between the touch electrode 565 and the touch line 564. However, embodiments of the present disclosure are not limited thereto, and the third inorganic insulating layer 583 can be disposed to extend to the lower portion of the touch line 564.

The third inorganic insulating layer 583 can be formed of a material having a refractive index lower than a refractive index of the first inorganic insulating layer 561 and the second inorganic insulating layer 562. For example, the third inorganic insulating layer 583 can be formed of an inorganic insulating material such as silicon oxide (SiOx), but is not limited thereto. When the third inorganic insulating layer 583 is formed of silicon oxide (SiOx), the refractive index of the third inorganic insulating layer 583 can be about 1.4 to about 1.5. However, as long as the refractive index of the third inorganic insulating layer 583 is less than the refractive index of the first inorganic insulating layer 561 and the second inorganic insulating layer 562, a material for configuring the third inorganic insulating layer 583 is not necessarily limited to inorganic materials.

In the light emitting display apparatus 500 according to another exemplary embodiment of the present disclosure, with the cut-off layer 580 at the non-light emitting area NEA, a color coordinate change caused by light emitted through the non-light emitting area NEA can be inhibited, while maintaining high light efficiency implemented by the micro-cavity in the light emitting area EA. If the cut-off layer 580 is disposed at the light emitting area EA, the efficiency of light emitted through the light emitting area EA can be reduced by the cut-off layer 580. Therefore, in the light emitting display apparatus 500 according to another exemplary embodiment of the present disclosure, the cut-off layer 580 is disposed at the non-light emitting area NEA, so that high light efficiency of light emitted from the light emitting area EA can be maintained. In addition, light which is emitted at a low emission angle from the light emitting layer 132, reflected from the reflective layer 131A disposed on the side portion of the protrusion portion 142, and then, extracted in the front direction through the non-light emitting area NEA, passes through the cut-off layer 580, so that a color coordinate change can be inhibited or prevented, and color gamut or color reproduction rate can be improved. In this case, the cut-off layer 580 forms an interface where a difference in refractive index occurs by a stacked structure of layers having different refractive indices, and can adjust transmittance of light having a specific wavelength by constructive interference and offset interference due to reflection at this interface. Accordingly, in the light emitting display apparatus 500 according to another exemplary embodiment of the present disclosure, by adjusting a thickness of the third inorganic insulating layer 583 between the first inorganic insulating layer 561 and the second inorganic insulating layer 562, a wavelength region in which constructive interference and offset interference occur by reflection at an interface between the first inorganic insulating layer 561 and the third inorganic insulating layer 583 and at an interface between the second inorganic insulating layer 562 and the third inorganic insulating layer 583 can be adjusted, and for example, the transmittance of light of a wavelength different from a wavelength of blue light can be lowered.

In addition, in the light emitting display apparatus 500 according to another exemplary embodiment of the present disclosure, the touch part 560 and the cut-off layer 580 can be integrally implemented. For example, the first inorganic insulating layer 561 and the second inorganic insulating layer 562 can be as components of the touch part 560 and can also be as components of the cut-off layer 580. Accordingly, in the light emitting display apparatus 500 according to another exemplary embodiment of the present disclosure, a process necessary for additionally forming the cut-off layer 580 can be minimized or reduced, and a manufacturing time and cost can also be minimized or reduced.

Figure 7:
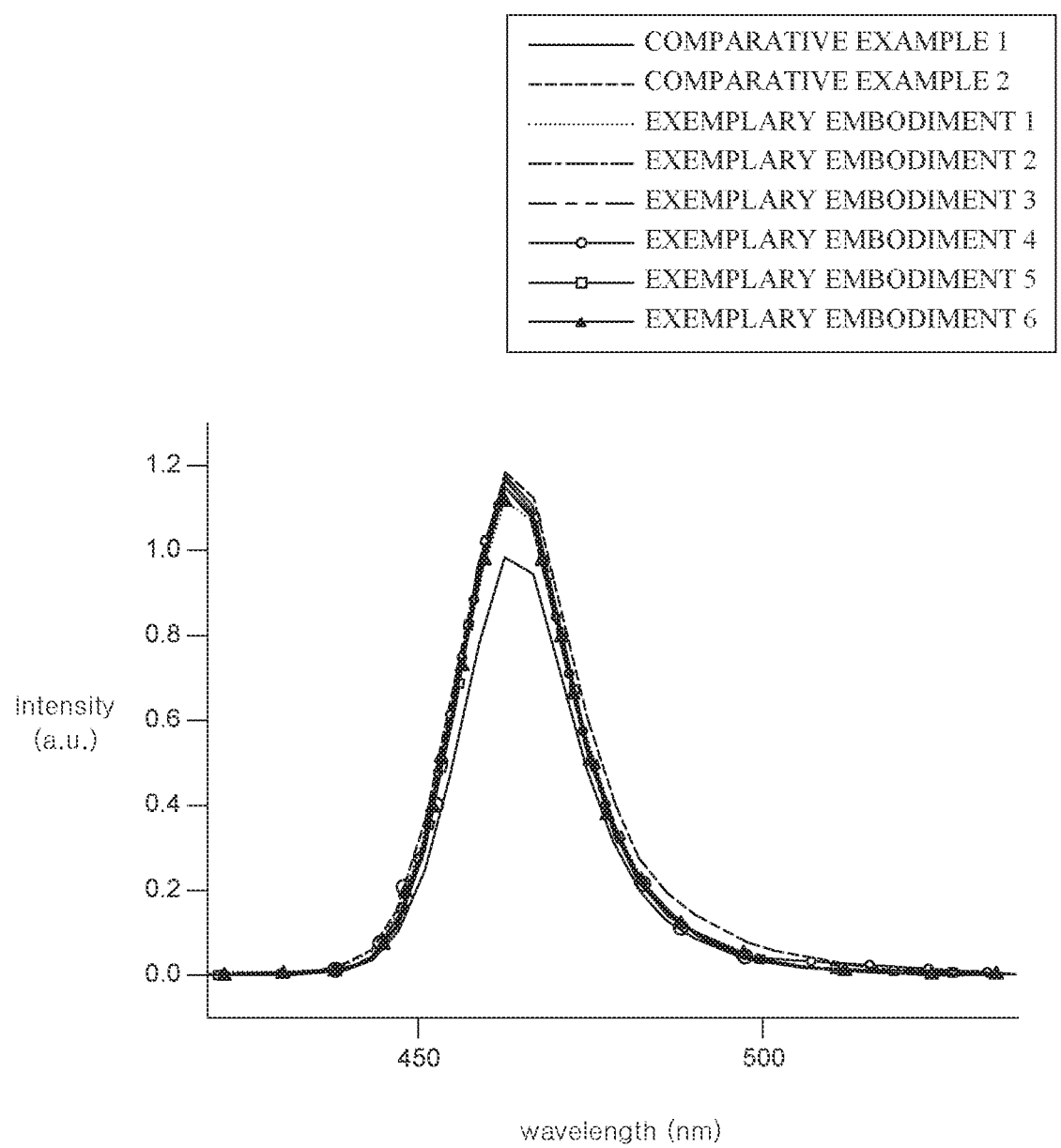
FIG. 7 illustrates light emission spectrum simulation results according to comparative examples and the exemplary embodiments of the present disclosure.

FIG. 7 illustrates light emission spectrum simulation results according to comparative examples and exemplary embodiments of the present disclosure. FIG. 7 shows luminance spectrum simulation results at respective wavelengths, of blue sub-pixels according to comparative example 1, comparative example 2, and exemplary embodiments 1 to 6 of the present disclosure.

First, the comparative example 1 is a related art light emitting display apparatus having a general structure to which a side reflection mirror structure is not applied. The comparative example 2 is a light emitting display apparatus, to which a side reflection mirror structure is applied in the structure of the comparative example 1 and from which the cut-off layer 180 of the light emitting display apparatus 100 according to an exemplary embodiment of the present disclosure is removed.

The exemplary embodiment 1 is the light emitting display apparatus 100 according to an exemplary embodiment of the present disclosure. The exemplary embodiment 2 is the light emitting display apparatus 400 according to another exemplary embodiment of the present disclosure, in which the thickness of the third encapsulation layer 153 is 200 nm, the thickness of the first inorganic insulating layer 481 is 60 nm, and the thickness of the second inorganic insulating layer 482 is 200 nm. The exemplary embodiment 3 is the light emitting display apparatus 400 according to another exemplary embodiment of the present disclosure, in which the thickness of the third encapsulation layer 153 is 200 nm, the thickness of the first inorganic insulating layer 481 is 80 nm, and the thickness of the second inorganic insulating layer 482 is 200 nm. The exemplary embodiment 4 is the light emitting display apparatus 400 according to another exemplary embodiment of the present disclosure, in which the thickness of the third encapsulation layer 153 is 200 nm, the thickness of the first inorganic insulating layer 481 is 100 nm, and the thickness of the second inorganic insulating layer 482 is 200 nm. The exemplary embodiment 5 is the light emitting display apparatus 400 according to another exemplary embodiment of the present disclosure, in which the thickness of the third encapsulation layer 153 is 200 nm, the thickness of the first inorganic insulating layer 481 is 120 nm, and the thickness of the second inorganic insulating layer 482 is 200 nm. The exemplary embodiment 6 is the light emitting display apparatus 400 according to another exemplary embodiment of the present disclosure, in which the thickness of the third encapsulation layer 153 is 200 nm, the thickness of the first inorganic insulating layer 481 is 140 nm, and the thickness of the second inorganic insulating layer 482 is 200 nm. When the thickness of the first inorganic insulating layer 481 is less than 60 nm, the photonic band gap shifts to an extremely short wavelength, and thus, blue efficiency itself can be significantly reduced, which is a problem. When the thickness of the first inorganic insulating layer 481 is greater than 140 nm, the photonic band gap shifts to an extremely long wavelength, so blue color coordinates can be excessively distorted although the blue efficiency does not decrease. In the present disclosure, the thickness of the first inorganic insulating layer 481 is 60 nm to 140 nm. In addition, in FIG. 7, simulation is applied to the light emitting display apparatus 400 according to another exemplary embodiment of the present disclosure. However, since the light emitting display apparatus 500 according to another exemplary embodiment of the present disclosure is also driven by the same principle as that of the light emitting display apparatus 400, the simulation results of FIG. 7 can also be applied to the light emitting display apparatus 500. Luminance values in FIG. 7 are the results of experiments by setting a peak value of the comparative example 1 to 1.

With reference to FIG. 7, since the side mirror structure was added in the comparative example 2, it could be confirmed that the peak value at the central wavelength increases in the comparative example 2, as compared to the comparative example 1. However, since light reflected by the side mirror structure has a PL component, it could be confirmed that the luminance value increases in a region having a wavelength longer than the central wavelength, for example, in a region having a wavelength of around 500 nm. Thus, in the comparative example 2, front luminance increases but a change in color coordinates of the blue sub-pixel can be caused, which is problematic.

Meanwhile, with reference to FIG. 7, since the side mirror structure is applied to all exemplary embodiments 1 to 6 of the present disclosure, it could be confirmed that the peak value at the central wavelength increases, as compared to the comparative example 1. In addition, in all exemplary embodiments 1 to 6 of the present disclosure, since the cut-off layers 180 and 480 are used, it could be confirmed that luminance values do not increase in the region having a wavelength longer than the central wavelength, for example, in the region having a wavelength of around 500 nm, and are substantially the same as the luminance value of the comparative example 1. Thus, in the exemplary embodiments 1 to 6 of the present disclosure, it could be confirmed that a color coordinate change is minimized, while improving light extraction efficiency. A more detailed description of the color coordinate change is provided with reference to FIGS. 8A and 8B.

Figure 8A:
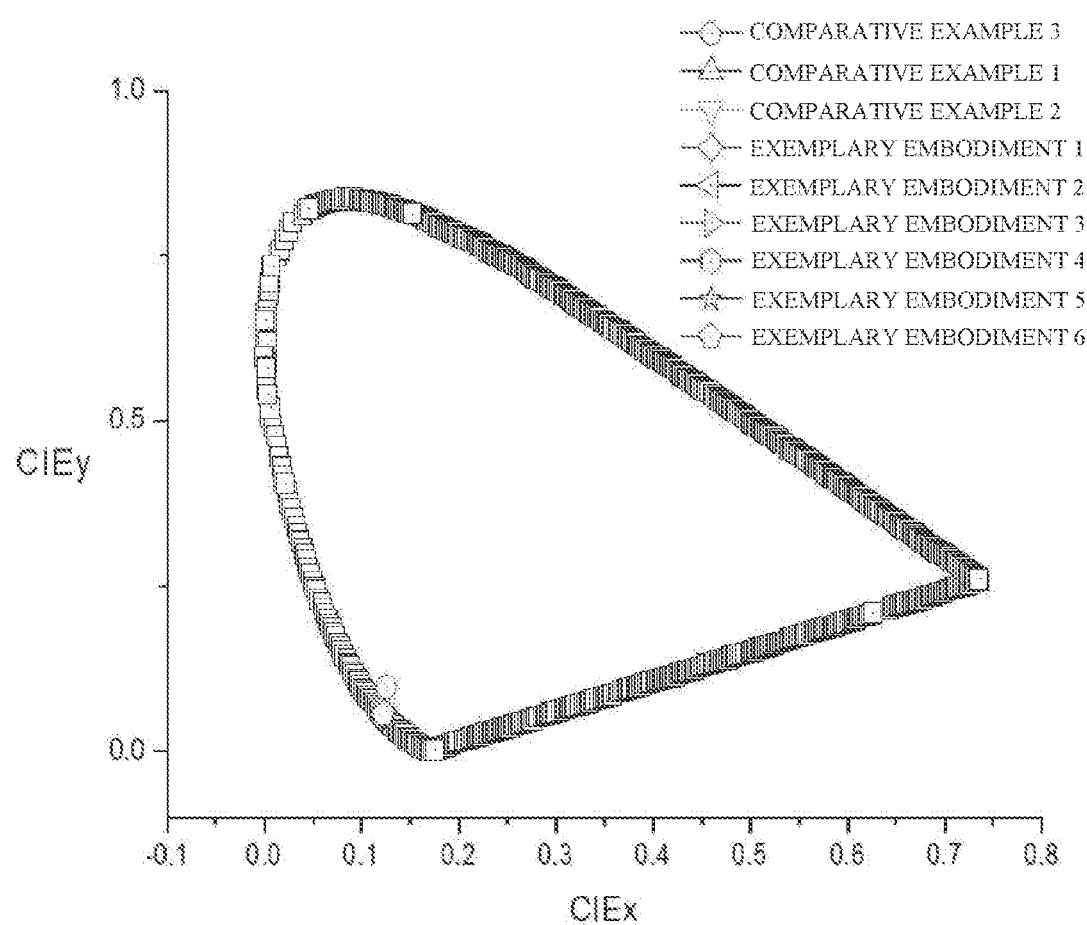
FIG. 8A and FIG. 8B are CIE coordinate systems for comparative examples and the exemplary embodiments of the present disclosure.
Figure 8B:
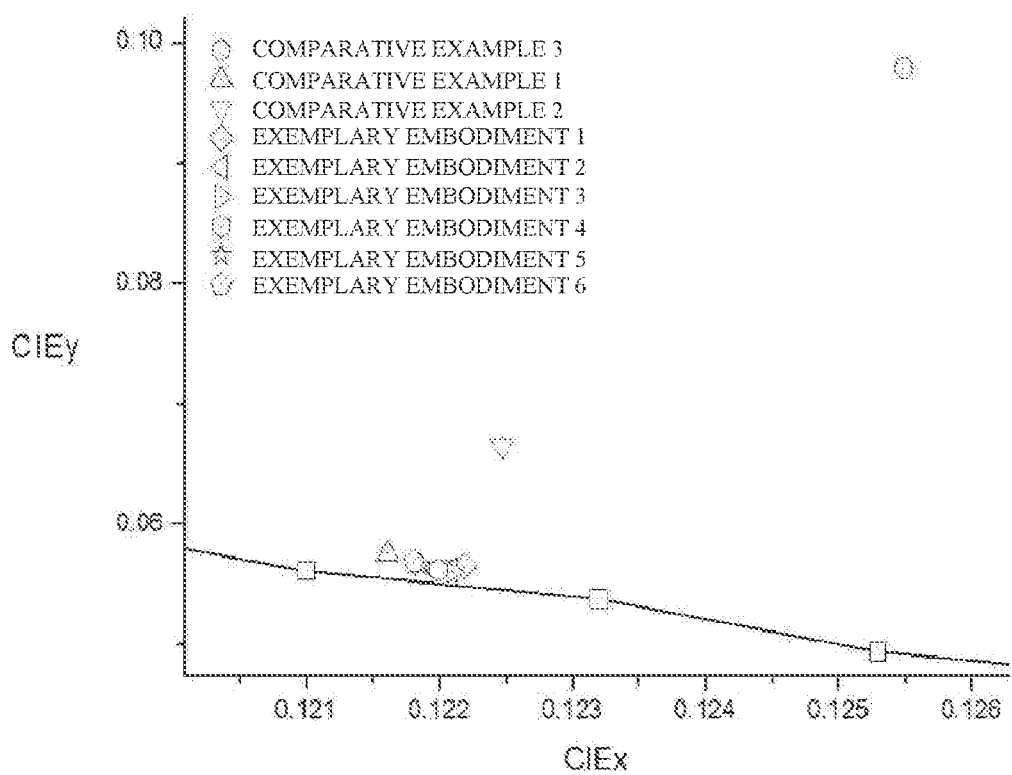

FIG. 8A and FIG. 8B are CIE coordinate systems for the comparative examples and the exemplary embodiments of the present disclosure. Comparative example 1, comparative example 2, and exemplary embodiments 1 to 6 of the present disclosure, illustrated in FIGS. 8A and 8B, are the same as the comparative example 1, the comparative example 2, and the exemplary embodiments 1 to 6 of the present disclosure that are described in FIG. 7, and FIGS. 8A and 8B illustrate blue color coordinates of the light emitted by these comparative examples and exemplary embodiments. Comparative example 3 represents blue color coordinates of general PL light. Since FIG. 8A is a graph showing the entire color coordinate area, it is difficult to accurately compare the comparative examples 1 to 3 and the exemplary embodiments 1 to 6 of the present disclosure. FIG. 8B is an enlarged view for a clearer comparison of the blue color coordinates.

The blue color coordinates of the light emitted by the comparative examples 1 to 3 and the exemplary embodiments 1 to 3 of the present disclosure are shown in Table 1 below.

TABLE 1

|  | CIEx | CIEy |
| --- | --- | --- |
| Comparative Example 1 | 0.122 | 0.058 |
| Comparative Example 2 | 0.122 | 0.067 |
| Comparative Example 3 | 0.125 | 0.098 |
| Exemplary Embodiment 1 | 0.122 | 0.056 |
| Exemplary Embodiment 2 | 0.122 | 0.056 |
| Exemplary Embodiment 3 | 0.122 | 0.056 |
| Exemplary Embodiment 4 | 0.122 | 0.056 |
| Exemplary Embodiment 5 | 0.122 | 0.057 |
| Exemplary Embodiment 6 | 0.122 | 0.057 |

First, comparing the comparative example 1 and the comparative example 3, with reference to Table 1, the comparative example 3 having PL characteristics is significantly different from the comparative example 1 having a general EL spectrum, in terms of the CIEy coordinate. In addition, comparing the comparative example 1 and the comparative example 2, the comparative example 1 and the comparative example 2 have a large difference in the CIEy coordinate, in that additionally extracted light has PL characteristics. Thus, in the comparative example 2, it could be confirmed that there is a problem in which a color coordinate change occurs.

However, although the side mirror structure is applied to all of the exemplary embodiments 1 to 6 of the present disclosure, since the cut-off layers 180 and 480 are applied to all of the exemplary embodiments 1 to 6 of the present disclosure, an increase in luminance is minimized in a region having a wavelength longer than the central wavelength, for example, in a region having a wavelength of around 500 nm. Thus, with reference to Table 1, the blue color coordinates of light emitted by the exemplary embodiments 1 to 6 of the present disclosure are substantially the same as the blue color coordinates of light emitted by the comparative example 1. Thus, in the exemplary embodiments 1 to 6 of the present disclosure, it could be confirmed that a color coordinate change is minimized, while improving light extraction efficiency.

Figure 9:
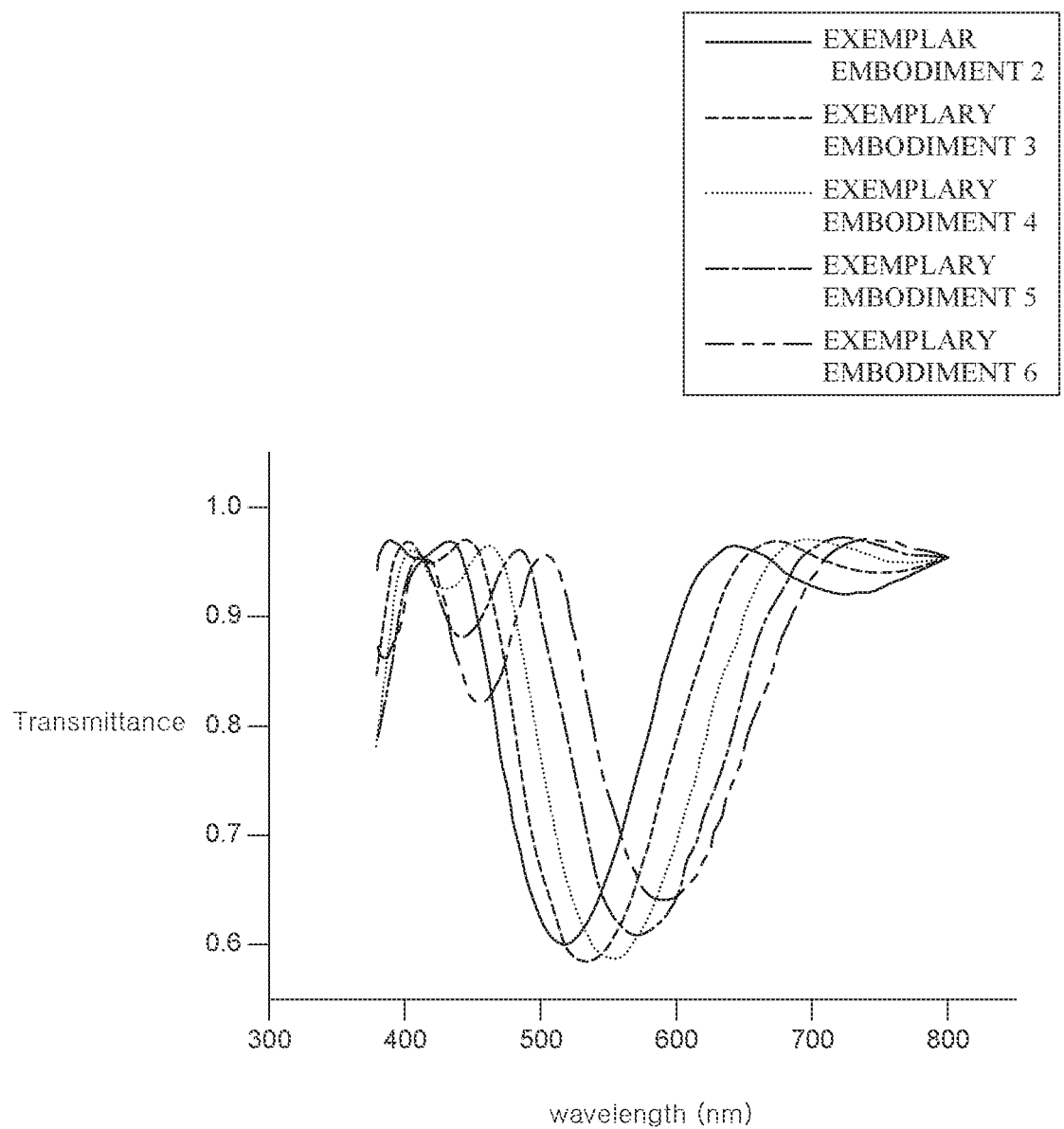
FIG. 9 illustrates simulation results of transmittance depending on a thickness of a cut-off layer of the light emitting display apparatus according to another exemplary embodiment of the present disclosure.

FIG. 9 illustrates simulation results of transmittance depending on a thickness of a cut-off layer of the light emitting display apparatus according to another embodiment of the present disclosure. Exemplary embodiments 2 to 6 of the present disclosure, illustrated in FIG. 9, are the same as the exemplary embodiments 2 to 6 that are described in FIG. 7. FIG. 9 shows the results of measuring transmittance at respective wavelengths for the exemplary embodiments 2 to 6 of the present disclosure. In FIG. 9, simulation is applied to the light emitting display apparatus 400 according to an exemplary embodiment of the present disclosure. However, since the light emitting display apparatus 500 according to an exemplary embodiment of the present disclosure is also driven by the same principle as that of the light emitting display apparatus 400, the simulation results of FIG. 7 can also be properly applied to the light emitting display apparatus 500.

As described above, it could be confirmed that a color coordinate change is minimized, while improving light extraction efficiency, in all of the exemplary embodiments 2 to 6 of the present disclosure. However, an increase in transmittance at a wavelength of 550 nm can have the greatest influence on a change in the CIEy color coordinate of the blue color coordinates. Accordingly, among the exemplary embodiments 2 to 6 of the present disclosure, the exemplary embodiments 3 and 4 which exhibit the lowest transmittance in the region having a wavelength of around 500 nm, can be most advantageous for the color coordinate change. Accordingly, in the light emitting display apparatus 400 according to another exemplary embodiment of the present disclosure, the thickness of the first inorganic insulating layer 481 can be about 80 nm to 100 nm.

A light emitting display apparatus according to one or more embodiments of the present disclosure will be described below.

A light emitting display apparatus according to an embodiment of the present disclosure comprises a substrate including a plurality of sub-pixels, an overcoating layer on the substrate and having a base portion and a protrusion portion, a first electrode disposed to cover the base portion and a side portion of the protrusion portion at the plurality of sub-pixels, a bank layer covering a portion of the first electrode and the overcoating layer, a light emitting layer and a second electrode on the first electrode and the bank layer at the plurality of sub-pixels, and a cut-off layer on the second electrode to overlap the bank layer.

According to some embodiments of the present disclosure, the plurality of sub-pixels can include a non-light emitting area in which the bank layer is disposed and a light emitting area surrounded by the non-light emitting area, wherein the cut-off layer can be disposed at the non-light emitting area.

According to some embodiments of the present disclosure, the plurality of sub-pixels can include a red sub-pixel, a green sub-pixel and a blue sub-pixel, wherein the cut-off layer can be disposed at the blue sub-pixel.

According to some embodiments of the present disclosure, the cut-off layer can be configured to transmit blue light.

According to some embodiments of the present disclosure, the light emitting display apparatus can further comprise an encapsulation part on the second electrode, wherein the cut-off layer can be a blue color filter on an upper surface of the encapsulation part.

According to some embodiments of the present disclosure, the light emitting display apparatus can further comprise an encapsulation part on the second electrode, wherein the encapsulation part can include a first encapsulation layer formed of an inorganic material, a second encapsulation layer on the first encapsulation layer and formed of an organic material, and a third encapsulation layer on the second encapsulation layer and formed of an inorganic material. The cut-off layer can include a portion of a third encapsulation layer, a first inorganic insulating layer on the third encapsulation layer and overlapping the bank layer, and a second inorganic insulating layer on the first inorganic insulating layer.

According to some embodiments of the present disclosure, the third encapsulation layer and the second inorganic insulating layer can be formed of a same material, and the first inorganic insulating layer can be formed of a material having a refractive index lower than a refractive index of the third encapsulation layer and the second inorganic insulating layer.

According to some embodiments of the present disclosure, the light emitting display apparatus can further comprise an encapsulation part on the second electrode, and a touch part on the encapsulation part, wherein the touch part can include a first inorganic insulating layer on the encapsulation part, a second inorganic insulating layer on the first inorganic insulating layer, and a touch line and a touch electrode on the first inorganic insulating layer or the second inorganic insulating layer, wherein the cut-off layer can include the first inorganic insulating layer, the second inorganic insulating layer, and a third inorganic insulating layer between the first inorganic insulating layer and the second inorganic insulating layer and overlapping the bank layer.

According to some embodiments of the present disclosure, the first inorganic insulating layer and the second inorganic insulating layer can be formed of silicon nitride (SiNx) or silicon oxynitride (SiNxOy), and the third inorganic insulating layer can be formed of silicon oxide (SiOX).

According to some embodiments of the present disclosure, the light emitting layer can be disposed separately in each of the plurality of sub-pixels, and a thickness of the light emitting layer can be configured to implement a micro-cavity in each of the plurality of sub-pixels.

According to some embodiments of the present disclosure, the first electrode may comprise a reflective layer that covers the side portion of the protrusion portion.

A light emitting display apparatus according to an embodiment of the present disclosure comprises a substrate including a sub-pixel having a light emitting area and a non-light emitting area, an overcoating layer having a protrusion portion protruding from the non-light emitting area, a light emitting element including a first electrode contacting the protrusion portion, a light emitting layer on the first electrode, and a second electrode on the light emitting layer, a bank layer covering a portion of the first electrode and the protrusion portion, and a color coordinate change prevention layer at the non-light emitting area on the light emitting element, to minimize a color coordinate change caused by light which is reflected and extracted from the first electrode contacting the protrusion portion, among light emitted from the light emitting layer.

According to some embodiments of the present disclosure, the color coordinate change prevention layer can be disposed to overlap the bank layer.

According to some embodiments of the present disclosure, the sub-pixel can be a blue sub-pixel.

According to some embodiments of the present disclosure, the light emitting display apparatus can further comprise an encapsulation part between the light-emitting element and the color coordinate change prevention layer, wherein the color coordinate change prevention layer can be a blue color filter on an upper surface of the encapsulation part.

According to some embodiments of the present disclosure, the color coordinate change prevention layer can include three inorganic insulating layers, wherein among the three inorganic insulating layers, a first inorganic insulating layer and a second inorganic insulating layer can be formed of a same material, and a third inorganic insulating layer can be formed of a material having a refractive index lower than a refractive index of the first inorganic insulating layer and the second inorganic insulating layer. The third inorganic insulating layer can be between the first inorganic insulating layer and the second inorganic insulating layer.

According to some embodiments of the present disclosure, the light emitting display apparatus can further comprise an encapsulation part on the light emitting element, wherein the first inorganic insulating layer can be an uppermost inorganic insulating layer of the encapsulation part.

According to some embodiments of the present disclosure, the light emitting display apparatus can be further comprise an encapsulation part on the light emitting element, wherein the first inorganic insulating layer can be disposed on an upper surface of the encapsulation part.

According to some embodiments of the present disclosure, the light emitting display apparatus can further comprise an encapsulation part on the light emitting element, and a touch part on the encapsulation part, wherein the color coordinate change prevention layer can be integrally provided with the touch part.

It will be apparent to those skilled in the art that various modifications and variations can be made in the present disclosure without departing from the technical idea or scope of the disclosure. Thus, it can be intended that embodiments of the present disclosure cover the modifications and variations of the disclosure provided they come within the scope of the appended claims and their equivalents.

What is claimed is:

1. A light emitting display apparatus, comprising:
   a substrate including a display area and a non-display area;
   a plurality of transistors disposed on the substrate;

a plurality of sub-pixels electrically connected to the plurality of transistors, respectively, each sub-pixel comprising a light emitting element;
an encapsulation part disposed on the light emitting element; and
a cut-off layer disposed on the encapsulation part of only a blue sub-pixel of the plurality of sub-pixels, the cut-off layer having an opening area and a non-opening area,
wherein the blue sub-pixel includes a light emitting area, the light emitting area being located at the opening area of the cut-off layer,
wherein the cut-off layer is disposed only at a non-light emitting area in the blue sub-pixel among the plurality of sub-pixels, and
wherein the cut-off layer transmits only blue light.

2. The light emitting display apparatus of claim 1,
wherein the light emitting element includes a light emitting layer,
wherein the light emitting display apparatus further comprises:
an overcoating layer on the substrate and having a base portion and a protrusion portion;
a first electrode disposed to cover the base portion and a side portion of the protrusion portion at the plurality of sub-pixels;
a bank layer covering a portion of the first electrode and the overcoating layer; and
the light emitting layer and a second electrode on the first electrode and the bank layer at the plurality of sub-pixels, and
wherein the plurality of sub-pixels include the non-light emitting area in which the bank layer is disposed and the light emitting area surrounded by the non-light emitting area.

3. The light emitting display apparatus of claim 2, wherein the plurality of sub-pixels include a red sub-pixel, a green sub-pixel and the blue sub-pixel.

4. The light emitting display apparatus of claim 2, wherein the encapsulation part is on the second electrode, and
wherein the cut-off layer includes a blue color filter on an upper surface of the encapsulation part.

5. The light emitting display apparatus of claim 2, wherein the encapsulation part is on the second electrode,
wherein the encapsulation part includes a first encapsulation layer formed of an inorganic material, a second encapsulation layer on the first encapsulation layer and formed of an organic material, and a third encapsulation layer on the second encapsulation layer and formed of an inorganic material, and
wherein the cut-off layer includes the third encapsulation layer, a first inorganic insulating layer on the third encapsulation layer and overlapping the bank layer, and a second inorganic insulating layer on the first inorganic insulating layer.

6. The light emitting display apparatus of claim 5, wherein the third encapsulation layer and the second inorganic insulating layer are formed of a same material, and
the first inorganic insulating layer is formed of a material having a refractive index lower than a refractive index of the third encapsulation layer or the second inorganic insulating layer.

7. The light emitting display apparatus of claim 2, further comprising:
a touch part on the encapsulation part,
wherein the encapsulation part is on the second electrode,
wherein the touch part includes:
a first inorganic insulating layer on the encapsulation part;
a second inorganic insulating layer on the first inorganic insulating layer; and
a touch line and a touch electrode on the first inorganic insulating layer or the second inorganic insulating layer, and
wherein the cut-off layer includes the first inorganic insulating layer, the second inorganic insulating layer, and a third inorganic insulating layer between the first inorganic insulating layer and the second inorganic insulating layer and overlapping the bank layer.

8. The light emitting display apparatus of claim 7, wherein the first inorganic insulating layer and the second inorganic insulating layer are formed of silicon nitride (SiNx) or silicon oxynitride (SiNxOy), and
wherein the third inorganic insulating layer is formed of silicon oxide (SiOx).

9. The light emitting display apparatus of claim 2, wherein the light emitting layer is disposed separately in each of the plurality of sub-pixels, and
wherein a thickness of the light emitting layer is configured to implement a micro-cavity in each of the plurality of sub-pixels.

10. The light emitting display apparatus of claim 2, wherein the first electrode comprises a reflective layer that covers the side portion of the protrusion portion.

11. The light emitting display apparatus of claim 2, wherein the cut-off layer overlaps the protrusion portion.

12. The light emitting display apparatus of claim 2, wherein the cut off layer is disposed on the first electrode.

13. The light emitting display apparatus of claim 1, wherein the cut-off layer is a touch part or a part of color filters.

14. The light emitting display apparatus of claim 1, wherein the cut-off layer transmits a wavelength of light having a predetermined color and cuts off wavelengths of light that are longer than the wavelength of light having the predetermined color.

15. A light emitting display apparatus, comprising:
a substrate including a display area and a non-display area;
a plurality of transistors disposed on the substrate;
a plurality of sub-pixels electrically connected to the plurality of transistors, respectively, each sub-pixel comprising a light emitting element;
an encapsulation part disposed on the light emitting element; and
a color coordinate change prevention layer disposed on the encapsulation part of only a blue sub-pixel of the plurality of sub-pixels, the color coordinate change prevention layer having an opening area and a non-opening area,
wherein the blue sub-pixel includes a light emitting area, the light emitting area being located at the opening area of the color coordinate change prevention layer,
wherein the color coordinate change prevention layer is disposed only at a non-light emitting area in the blue sub-pixel among the plurality of sub-pixels, and
wherein the cut-off layer transmits only blue light.

16. The light emitting display apparatus of claim 15, wherein the light emitting element includes a light emitting layer,
wherein the light emitting display apparatus further comprises:

an overcoating layer having a protrusion portion protruding from the non-light emitting area of the blue sub-pixel;

the light emitting element including a first electrode contacting the protrusion portion, the light emitting layer on the first electrode, and a second electrode on the light emitting layer; and a bank layer covering a portion of the first electrode and the protrusion portion, and wherein the color coordinate change prevention layer is disposed to overlap the bank layer.

17. The light emitting display apparatus of claim 16, wherein the encapsulation part is between the light-emitting element and the color coordinate change prevention layer, and wherein the color coordinate change prevention layer includes a blue color filter on an upper surface of the encapsulation part.

18. The light emitting display apparatus of claim 16, wherein the color coordinate change prevention layer includes three inorganic insulating layers, and wherein among the three inorganic insulating layers, a first inorganic insulating layer and a second inorganic insulating layer are formed of a same material, and a third inorganic insulating layer is formed of a material having a refractive index lower than a refractive index of the first inorganic insulating layer or the second inorganic insulating layer.

19. The light emitting display apparatus of claim 18, wherein the first inorganic insulating layer is an uppermost inorganic insulating layer of the encapsulation part.

20. The light emitting display apparatus of claim 18, wherein the first inorganic insulating layer is disposed on an upper surface of the encapsulation part.

21. The light emitting display apparatus of claim 18, further comprising:

a touch part on the encapsulation part, wherein the color coordinate change prevention layer is integrally provided with the touch part.

22. The light emitting display apparatus of claim 15, wherein the color coordinate change prevention layer transmits a wavelength of light having a predetermined color and cuts off wavelengths of light that are longer than the wavelength of light having the predetermined color.

23. A light emitting display apparatus, comprising:

a substrate including a display area and a non-display area;

a plurality of transistors disposed on the substrate;

a plurality of sub-pixels electrically connected to the plurality of transistors, respectively, and including a light emitting area and a non-light emitting area, each sub-pixel comprising a light emitting element;

an encapsulation part disposed on the light emitting element; and a cut-off layer disposed on the encapsulation part of only a blue sub-pixel of the plurality of sub-pixels, and positioned only on the non-light emitting area and not on the light emitting area of the blue sub-pixel, wherein the cut-off layer is disposed only at the non-light emitting area in the blue sub-pixel among the plurality of sub-pixels, and wherein the cut-off layer transmits only blue light.

24. The light emitting display apparatus of claim 23, wherein the cut-off layer transmits a wavelength of light having a predetermined color and cuts off wavelengths of light that are longer than the wavelength of light having the predetermined color.

* * * * *